(12) United States Patent
Hsieh et al.

(10) Patent No.: US 11,987,494 B2
(45) Date of Patent: May 21, 2024

(54) WIRE-BOND DAMPER FOR SHOCK ABSORPTION

(71) Applicant: Taiwan Semiconductor Manufacturing Co., Ltd., Hsinchu (TW)

(72) Inventors: Tsung-Lin Hsieh, Hsinchu (TW); Wei-Jhih Mao, Hsinchu (TW); Shang-Ying Tsai, Pingzhen (TW); Kuei-Sung Chang, Kaohsiung (TW); Chun-Wen Cheng, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 398 days.

(21) Appl. No.: 17/194,492

(22) Filed: Mar. 8, 2021

(65) Prior Publication Data

US 2022/0162058 A1     May 26, 2022

Related U.S. Application Data

(60) Provisional application No. 63/117,518, filed on Nov. 24, 2020.

(51) Int. Cl.
    *B81B 7/00*     (2006.01)
    *B81C 1/00*     (2006.01)

(52) U.S. Cl.
    CPC ........ *B81B 7/0058* (2013.01); *B81C 1/00333* (2013.01); *B81B 2203/0307* (2013.01)

(58) Field of Classification Search
    CPC .......... B81B 7/0058; B81B 2203/0307; B81B 2201/025; B81B 7/0016; B81B 3/0051;
(Continued)

(56) References Cited

U.S. PATENT DOCUMENTS

| 7,540,190 B2 * | 6/2009 | Sasaki | G01P 1/023 |
| | | | 73/514.16 |
| 7,849,572 B2 | 12/2010 | Kinoshita | |

(Continued)

FOREIGN PATENT DOCUMENTS

| JP | H0262967 A | 3/1990 |
| JP | 2012019034 A | 1/2012 |
| JP | 2016003993 A | 1/2016 |

*Primary Examiner* — Shahed Ahmed
*Assistant Examiner* — Sun Mi Kim King
(74) *Attorney, Agent, or Firm* — Eschweiler & Potashnik, LLC

(57) ABSTRACT

Various embodiments of the present disclosure are directed towards a microelectromechanical systems (MEMS) package comprising a wire-bond damper. A housing structure overlies a support substrate, and a MEMS structure is between the support substrate and the housing structure. The MEMS structure comprises an anchor, a spring, and a movable mass. The spring extends from the anchor to the movable mass to suspend and allow movement of the movable mass in a cavity between the support substrate and the housing structure. The wire-bond damper is on the movable mass or structure surrounding the movable mass. For example, the wire-bond damper may be on a top surface of the movable mass. As another example, the wire-bond damper may be on the support substrate, laterally between the anchor and the movable mass. Further, the wire-bond damper comprises a wire formed by wire bonding and configured to dampen shock to the movable mass.

20 Claims, 22 Drawing Sheets

(58) Field of Classification Search
CPC .............. B81B 7/02; B81B 2201/0235; B81B 2201/0257; B81B 2201/04; B81B 2203/0163; B81B 2203/051; B81C 1/00333; B81C 1/00198; B81C 1/00261; B81C 1/00341; G01P 2015/0871; G01P 15/0802

See application file for complete search history.

(56) References Cited

U.S. PATENT DOCUMENTS

| | | |
|---|---|---|
| 9,604,840 B1 | 3/2017 | Cheng et al. |
| 2001/0020545 A1* | 9/2001 | Eldridge ............. H01L 25/0652 257/E21.507 |
| 2005/0016271 A1 | 1/2005 | Hashimoto et al. |
| 2005/0217373 A1 | 10/2005 | Ishikawa et al. |
| 2006/0055062 A1 | 3/2006 | Ohta |
| 2006/0086185 A1 | 4/2006 | Tanaka et al. |
| 2007/0190819 A1* | 8/2007 | Kariya .................... H01L 24/13 439/70 |
| 2012/0120470 A1 | 5/2012 | Kitazawa et al. |
| 2015/0185467 A1 | 7/2015 | Joshi et al. |
| 2017/0073220 A1* | 3/2017 | Duqi ..................... B81B 7/0048 |
| 2018/0252739 A1 | 9/2018 | Malvern |

\* cited by examiner

WIRE-BOND DAMPER FOR SHOCK ABSORPTION

REFERENCE TO RELATED APPLICATION

This application claims the benefit of U.S. Provisional Application No. 63/117,518, filed on Nov. 24, 2020, the contents of which are hereby incorporated by reference in their entirety.

BACKGROUND

Microelectromechanical systems (MEMS) devices are microscopic devices that integrate mechanical and electrical components to sense physical quantities and/or to act upon surrounding environments. In recent years, MEMS devices have become increasingly common. For example, MEMS accelerometers are commonly found in, among other things, airbag deployment systems, tablet computers, and smart phones.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
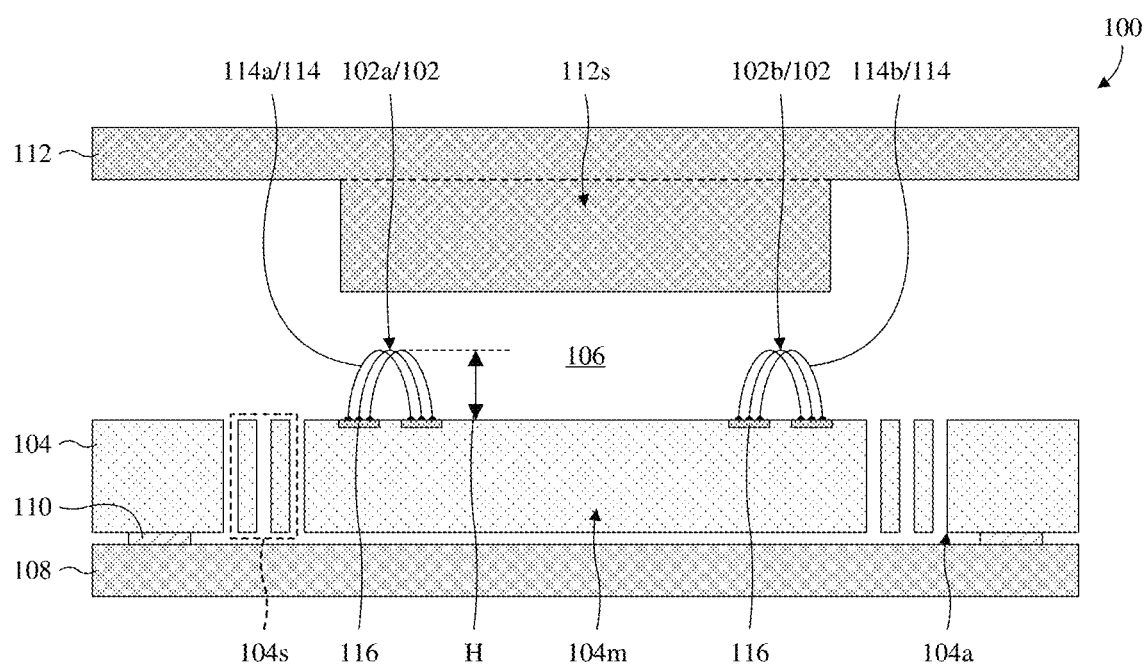
FIG. 1 provides a cross-sectional view of some embodiments of a microelectromechanical systems (MEMS) package comprising an out-of-plane (OoP) wire-bond damper.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A microelectromechanical systems (MEMS) package may comprise a support substrate, a housing structure, and a MEMS structure. The housing structure overlies and surrounds the support substrate. The MEMS structure is between the housing structure and the support substrate. Further, the MEMS structure comprises a movable mass, a spring, and an anchor. The anchor is fixed, and the spring extends from the anchor to the movable mass to suspend the movable mass in a cavity between the support substrate and the housing structure. During use, the movable mass moves within the cavity. This movement is then sensed via capacitive coupling, the piezoelectric effect, or some other suitable phenomenon.

A challenge with the MEMS package is that the MEMS structure is susceptible to damage from sudden shock. For example, sudden shock may cause the movable mass to collide with the housing structure and undergo damage. Such damage may lead to complete failure of the MEMS structure or may reduce performance (e.g., sensitivity or some other suitable performance metric) of the MEMS structure. As MEMS packages become smaller and smaller and hence more fragile, this challenge is expected to become more and more prominent. One approach to reduce the likelihood of damage from sudden shock is to increase the stiffness of the spring. However, this reduces the sensitivity of the MEMS structure.

Various embodiments of the present disclosure are directed towards a MEMS package comprising a wire-bond damper, as well as a method for forming the MEMS package. According to some embodiments, the MEMS package comprise a support substrate, a housing structure, a MEMS structure, and the wire-bond damper. The housing structure overlies the substrate, and the MEMS structure is between the support substrate and the housing structure. The MEMS structure comprises an anchor, a spring, and a movable mass. The anchor is fixed, and the spring extends from the anchor to the movable mass to suspend and allow movement of the movable mass in a cavity between the support substrate and the housing structure. The wire-bond damper is on the movable mass or is on structure surrounding the movable mass. For example, the wire-bond damper may be on a top surface of the movable mass. As another example, the wire-bond damper may be on the support substrate, laterally between the anchor and the movable mass. Further, the wire-bond damper comprises one or more wires formed by wire bonding and configured to dampen in-plane and/or out-of-plane shock.

Because of the wire-bond damper, sudden shock to the MEMS package may be dampened. For example, sudden shock may cause the movable mass to accelerate toward surrounding structure. When the wire-bond damper is on the movable mass and the movable mass gets too close to the surrounding structure, the wire-bond damper may come into contact with the surrounding structure and may absorb kinetic energy of the movable mass to prevent damage. When the wire-bond damper is off to a side of the movable mass and the movable mass gets too close to the surrounding structure, the wire-bond damper may come into contact with the movable mass and may absorb kinetic energy of the movable mass to prevent damage. Because the wire-bond damper provides damping independent of the spring, sensitivity is not impacted, or is minimally impacted, by inclusion of the wire-bond damper.

With reference to FIG. 1, a cross-sectional view 100 of some embodiments of a MEMS package comprising a plurality of out-of-plane (OoP) wire-bond dampers 102 is provided. The OoP wire-bond dampers 102 overlie a MEMS structure 104 on a movable mass 104m of the MEMS structure 104 and are respectively on opposite sides of the movable mass 104m. As will be described in more detail hereafter, the OoP wire-bond dampers 102 are configured to absorb kinetic energy of the movable mass 104m when the movable mass 104m gets too close to overlying structure to prevent damage.

In addition to the movable mass 104m, the MEMS structure 104 has springs 104s and an anchor 104a. The anchor 104a is fixed at a periphery of the MEMS structure 104 and has a pair of segments respectively on opposite sides of the movable mass 104m. The movable mass 104m is movable relative to the anchor 104a within a cavity 106. The springs 104s are respectively on the opposite sides and extend to the movable mass 104m respectively from the segments of the anchor 104a to suspend the movable mass 104m within the cavity 106 and to facilitate movement of the movable mass 104m. The MEMS structure 104 may, for example, be a motion sensor structure, an optical image stabilization (OIS) structure, a microphone structure, or some other suitable type of MEMS structure.

A support substrate 108 underlies the MEMS structure 104 and is separated from the MEMS structure 104 by a spacer dielectric layer 110. A housing structure 112 covers the OoP wire-bond dampers 102, the MEMS structure 104, and the support substrate 108. Further, the housing structure 112 comprises a stopper 112s. The stopper 112s overlies the movable mass 104m in the cavity 106 and is configured to limit OoP motion of the movable mass 104m to prevent overextension and hence damage to the springs 104s. OoP motion corresponds to motion out of a plane along which the MEMS structure 104 is elongated. Hence, OoP motion may be vertical motion within the cross-sectional view 100 of FIG. 1.

The OoP wire-bond dampers 102 are configured to dampen OoP motion and comprise individual pluralities of OoP damper wires 114 formed by wire bonding. For example, a first OoP wire-bond damper 102a may comprise a plurality of first OoP damper wires 114a and a second OoP wire-bond damper 102b may comprise a plurality of second OoP damper wires 114b. The OoP damper wires 114 arch between corresponding OoP damper pads 116 inset into a top of the movable mass 104m. For example, the first OoP damper wires 114a may arch from a first OoP damper pad inset into the top to a second OoP damper pad inset into the top. Because the OoP damper wires 114 arch between OoP damper pads, the OoP damper wires 114 have a loop-shaped profile and may hence also be known as loop-type wires.

Figure 2:
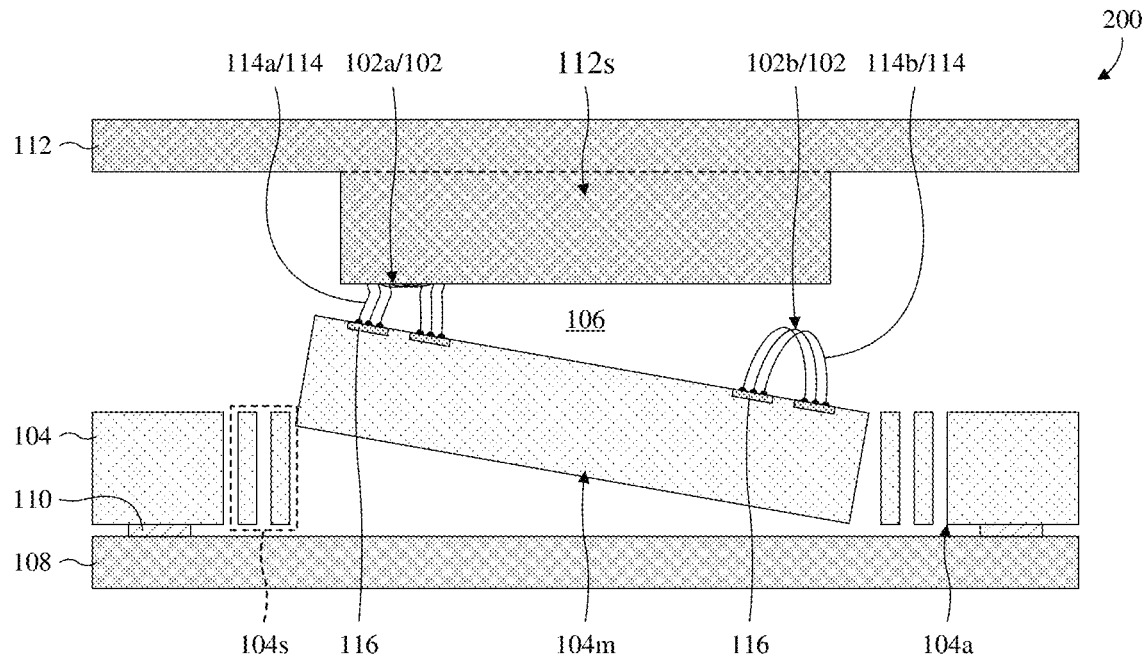
FIG. 2 provides a cross-sectional view of some embodiments of the MEMS package of FIG. 1 in which the OoP wire-bond damper is absorbing shock.

If the movable mass 104m undergoes a sudden shock that moves the movable mass 104m towards the housing structure 112, one or both of the OoP wire-bond dampers 102 may come into contact with the housing structure 112 and may absorb kinetic energy of the movable mass 104m. FIG. 2 provides a cross-sectional view 200 of some embodiments of the MEMS package of FIG. 1 in which the first OoP wire-bond damper 102a comes into contact with the housing structure 112 and absorbs kinetic energy. By absorbing the kinetic energy, the OoP wire-bond dampers 102 may dampen the sudden shock and may prevent the movable mass 104m from colliding with the housing structure 112. This may, in turn, prevent damage to the movable mass 104m. Because the OoP wire-bond dampers 102 provide damping independent of the springs 104s, sensitivity of the MEMS package is not impacted, or is otherwise minimally impacted, by inclusion of the OoP wire-bond dampers 102.

With continued reference to FIG. 1, the OoP damper wires 114 and the OoP damper pads 116 are conductive and may, for example, be or comprise gold, copper, silver, aluminum, some other suitable metal(s), or any combination of the foregoing. In some embodiments, the OoP damper wires 114 and the OoP damper pads 116 are the same material. In other embodiments, the OoP damper wires 114 and the OoP damper pads 116 are different materials. In some embodiments, the OoP damper wires 114 and the OoP damper pads 116 are electrically floating. In other embodiments, the OoP damper wires 114 and the OoP damper pads 116 are grounded or otherwise biased through conductive paths (not shown) in the MEMS structure 104.

In some embodiments, the OoP damper wires 114 have circular cross sections. The larger the diameters of the OoP damper wires 114 are, the more rigid the OoP damper wires 114 are. Further, the smaller the diameters of the OoP damper wires 114 are, the less rigid the OoP damper wires 114 are. In some embodiments, the OoP damper wires 114 have the same diameters. In alternative embodiments, the OoP damper wires 114 have different diameters. In at least some embodiments, the OoP damper wires 114 have diameters of about 15-50 micrometers, about 15-30 micrometers, about 30-50 micrometers, or some other suitable values. If the diameters are too small (e.g., less than about 15 micrometers or some other suitable value), the OoP damper wires 114 may have too little rigidity to absorb a meaningful amount of kinetic energy from the movable mass 104m, whereby the movable mass 104m may collide with the housing structure 112 in response to a sudden shock. If the diameters are too large (e.g., greater than about 50 micrometers or some other suitable value), the OoP damper wires 114 may have too much rigidity to dampen the sudden shock.

In alternative embodiments, the OoP damper wires 114 have rectangular cross sections or some other suitable cross sections. In some embodiments in which the OoP damper wires 114 have rectangular cross sections, the OoP damper wires 114 may be referred to as ribbon-type wires. Further, in some embodiments in which the OoP damper wires 114 have rectangular cross sections, the OoP damper wires 114 have a width of about 5-300 micrometers, about 5-150 micrometers, about 150-300 micrometers, or some other suitable value. If the widths are too small (e.g., less than about 5 micrometers or some other suitable value), the OoP damper wires 114 may have too little rigidity to provide meaningful damping. On the other hand, if the widths are too large (e.g., greater than about 300 micrometers or some other suitable value), the OoP damper wires 114 may have too much rigidity to provide meaningful damping.

In some embodiments, the OoP damper wires 114 have heights H of about 50-300 micrometers, about 50-175 micrometers, about 175-300 micrometers, or some other suitable values. If the heights H are too small (e.g., less than about 50 micrometers or some other suitable value), the OoP damper wires 114 may have too little distance to travel for absorption of kinetic energy and may not provide meaningful damping. On the other hand, if the heights H are too large (e.g., greater than about 300 micrometers or some other suitable value), the OoP damper wires 114 may have too little rigidity to provide meaningful damping. The larger the heights H are, the less rigid the OoP damper wires 114 are. Further, the smaller the heights H are, the more rigid the OoP damper wires 114 are. In some embodiments, the heights H are the same. In other embodiments, the heights H are different.

In some embodiments, the cavity 106 is hermetically sealed outside the cross-sectional view 100 of FIG. 1, such that the cavity 106 is separate from an atmosphere on an opposite side of the housing structure 112 as the cavity 106. In some embodiments, the housing structure 112 extends along sidewalls of the MEMS structure 104 and the support substrate 108 to a package substrate (not shown) underlying the support substrate 108. In some embodiments, the housing structure 112 is a polymer or some other suitable type of material.

In some embodiments, the support substrate 108 is a print circuit board (PCB), such that the support substrate 108 has a plurality of conductive traces (not shown) and vias (not shown). In other embodiments, the support substrate 108 is an integrated circuit (IC) die or some other suitable type of substrate. Further, in other embodiments, the support substrate 108 is a bulk substrate of silicon or some other suitable type of semiconductor substrate.

In some embodiments, the MEMS structure 104 is or comprises monocrystalline silicon, polycrystalline silicon, or some other suitable type semiconductor material. In other embodiments, the MEMS structure 104 is or comprises a piezoelectric material or some other suitable type of material. The piezoelectric material may, for example, be or comprise aluminum nitride, lead zirconate titanate (PZT), or some other suitable type of piezoelectric material. In some embodiments, the MEMS structure 104 comprises conductive features embedded therein. For example, a bulk of the MEMS structure 104 may be made up of silicon, a piezoelectric material, or some other suitable type of material, and the conductive features may be embedded therein. The conductive features may, for example, be metal wires, doped semiconductor regions, or other suitable types of conductive features.

In some embodiments, the spacer dielectric layer 110 is silicon oxide and/or some other suitable dielectric(s). Further, in some embodiments, the spacer dielectric layer 110 is a dielectric adhesive or some other suitable material.

Figure 3:
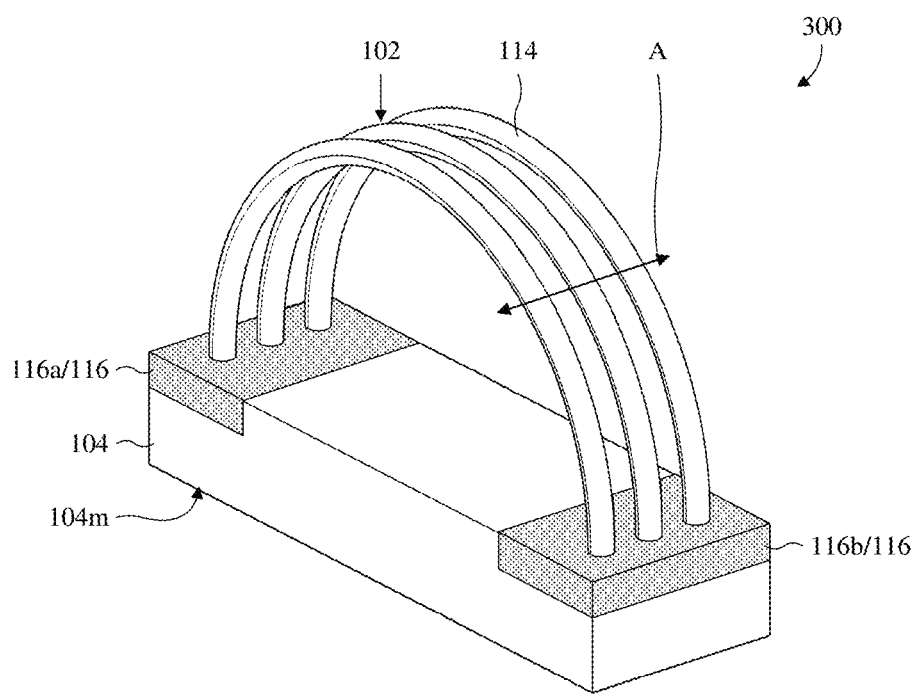
FIG. 3 provides a perspective view of some embodiments of the OoP wire-bond damper of FIG. 1.

With reference to FIG. 3, a perspective view 300 of some embodiments of an OoP wire-bond damper 102 of FIG. 1 is provided. The OoP wire-bond damper 102 is representative of each of the OoP wire-bond dampers 102 of FIG. 1 and is hence not specifically identified as either the first or second OoP wire-bond damper 102a, 102b of FIG. 1. Further, for ease and clarity of illustration, hashing is omitted from the movable mass 104m and the OoP damper wires 114 are not show as solid black.

The OoP wire-bond damper 102 comprises three OoP damper wires 114. In alternative embodiments, the OoP wire-bond damper 102 has more or less OoP damper wires 114. The OoP damper wires 114 arch from a first OoP damper pad 116a to a second OoP damper pad 116b and have circular cross sections from the first OoP damper pad 116a to the second OoP damper pad 116b. As such, the OoP damper wires 114 may have circular cross sections along line A. In alternative embodiments, the OoP damper wires 114 have oval shaped cross sections or some other suitable cross sections. Further, the OoP damper wires 114 have the same size and shape and are centered on and evenly spaced along a common axis. The common axis may, for example, extend in parallel with line A. In alternative embodiments, the OoP damper wires 114 have different sizes and/or different shapes. Further, in alternative embodiments, the OoP damper wires 114 are centered on different axes that extend parallel with line A and/or are unevenly spaced along line A.

In some embodiments, as described above, the OoP damper wires 114 have diameters of about 15-50 micrometers, about 15-30 micrometers, about 30-50 micrometers, or some other suitable values. The diameters may, for example, extend along line A. If the diameters are too small (e.g., less than about 15 micrometers or some other suitable value), the OoP damper wires 114 may have too little rigidity to provide meaningful damping. If the diameters are too large (e.g., greater than about 50 micrometers or some other suitable value), the OoP damper wires 114 may have too much rigidity to provide meaningful damping.

Figure 4:
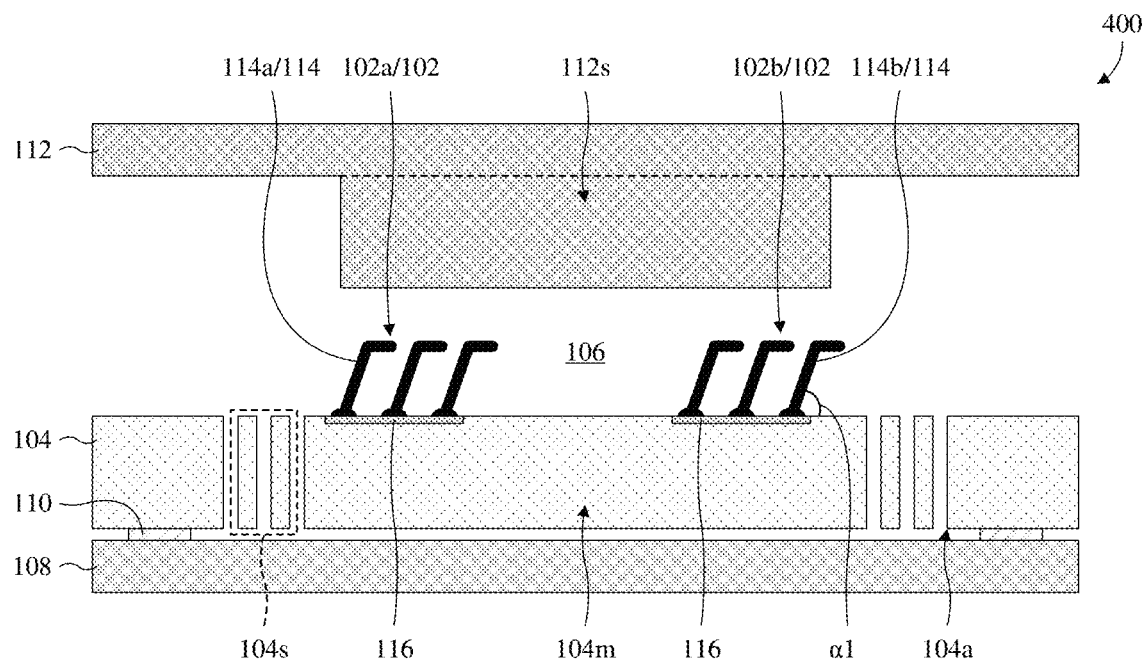
FIG. 4 provides a cross-sectional view of some alternative embodiments of the MEMS package of FIG. 1 in which OoP damper wires of the OoP wire-bond damper are ribbon type.

With reference to FIG. 4, a cross-sectional view 400 of some alternative embodiments of the MEMS package of FIG. 1 is provided in which the OoP damper wires 114 have first ends affixed to corresponding OoP damper pads 116 and have second ends, respectively opposite the first ends, that are elevated above and spaced from the movable mass 104*m*. Further, the OoP damper wires 114 have rectangular cross sections from the first ends to the second ends. As such, the OoP damper wires 114 are ribbon-type wires.

In some embodiments, each of the OoP damper wires 114 has a first segment and a second segment arranged end to end. The first segment extends from the movable mass 104*m* at a first angle α1 relative to a top surface of the movable mass 104*m*. The second segment extends from the first segment parallel to the top surface of the movable mass 104*m* or at a second angle relative to the top surface that is less than the first angle. In some embodiments, each OoP wire-bond damper 102 has an individual OoP damper pad 116 and each OoP damper wire 114 of the OoP wire-bond damper shares the individual OoP damper pad 116.

Figure 5:
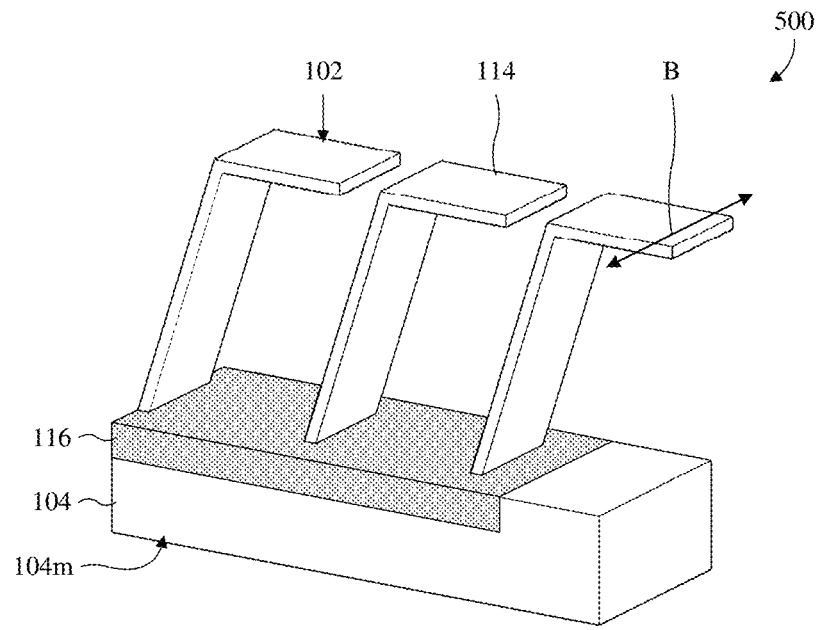
FIG. 5 provides a perspective view of some embodiments of the OoP wire-bond damper of FIG. 4.

With reference to FIG. 5, a perspective view 500 of some embodiments of an OoP wire-bond damper 102 of FIG. 4 is provided. The OoP wire-bond damper 102 is representative of each of the OoP wire-bond dampers 102 of FIG. 4 and is hence not specifically identified as either the first or second OoP wire-bond damper 102*a*, 102*b* of FIG. 4. Further, for ease and clarity of illustration, hashing is omitted from the movable mass 104*m* and the OoP damper wires 114 are not show as solid black.

The OoP wire-bond damper 102 comprises three OoP damper wires 114. In alternative embodiments, the OoP wire-bond damper 102 has more or less OoP damper wires 114. The OoP damper wires 114 have rectangular cross sections from first ends at the movable mass 104*m* to second ends respectively opposite the first ends. As such, the OoP damper wires 114 may have rectangular cross sections along line B. In alternative embodiments, the OoP damper wires 114 have square shaped cross sections or some other suitable cross sections. Further, the OoP damper wires 114 have the same size and shape and are centered on and evenly spaced along a common axis. The common axis may, for example, extend orthogonal to line B. In alternative embodiments, the OoP damper wires 114 have different sizes and/or different shapes. Further, in alternative embodiments, the OoP damper wires 114 are centered on different axes that extend orthogonal to line B and/or are unevenly spaced along line B.

In some embodiments, the OoP damper wires 114 have widths of about 5-300 micrometers, about 5-150 micrometers, about 150-300 micrometers, or some other suitable values. The widths may, for example, correspond to dimensions extending in parallel with line B. If the widths are too small (e.g., less than about 5 micrometers or some other suitable value), the OoP damper wires 114 may have too little rigidity to provide meaningful damping. On the other hand, if the widths are too large (e.g., greater than about 300 micrometers or some other suitable value), the OoP damper wires 114 may have too much rigidity to provide meaningful damping. In some embodiments, the widths of the OoP damper wires 114 are the same. In other embodiments, the widths of the OoP damper wires 114 are different.

Figure 6:
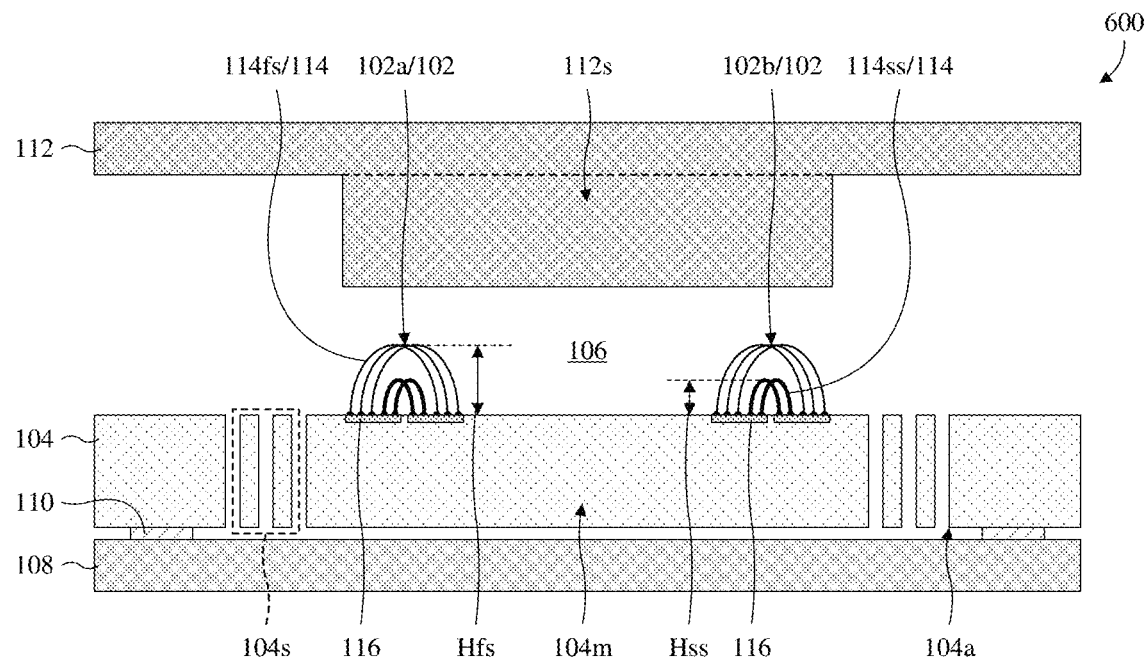
FIG. 6 provides a cross-sectional view of some alternative embodiments of the MEMS package of FIG. 1 in which the OoP wire-bond damper is a multi-stage damper.

With reference to FIG. 6, a cross-sectional view 600 of some alternative embodiments of the MEMS package of FIG. 1 is provided in which the OoP wire-bond dampers 102 are multi-stage dampers. As such, the OoP wire-bond dampers 102 comprise individual pluralities of first-stage OoP damper wires 114*fs* and further comprise individual pluralities of second-stage OoP damper wires 114*ss*.

The first-stage OoP damper wires 114*fs* and the second-stage OoP damper wires 114*ss* arch between corresponding OoP damper pads 116, such that the first-stage OoP damper wires 114*fs* and the second-stage OoP damper wires 114*ss* have a loop-shaped profile and may hence also be known as loop-type wires. Further, the first-stage OoP damper wires 114*fs* arch respectively over the second-stage OoP damper wires 114*ss*. The first-stage OoP damper wires 114*fs* have a first height Hfs, and the second-stage OoP damper wires 114*ss* have a second height Hss less than the first height Hfs. Further, the first-stage OoP damper wires 114*fs* have a cross-sectional profile with a lesser area than the second-stage OoP damper wires 114*ss*. For example, when the first-stage OoP damper wires 114*fs* and the second-stage OoP damper wires 114*ss* have circular cross-sections, the first-stage OoP damper wires 114*fs* may have a lesser diameter than the second-stage OoP damper wires 114*ss*.

Figure 7A:
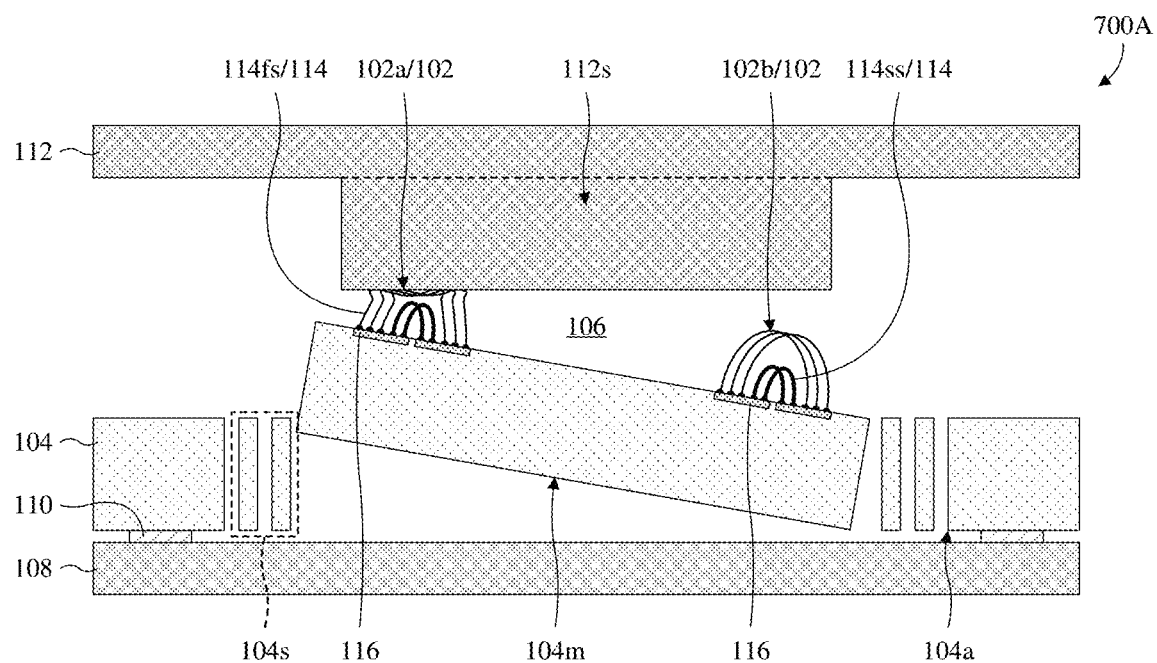
FIGS. 7A and 7B provide cross-sectional views of some embodiments of the MEMS package of FIG. 6 in which the OoP wire-bond damper is absorbing shock at multiple different stages of the OoP wire-bond damper.
Figure 7B:
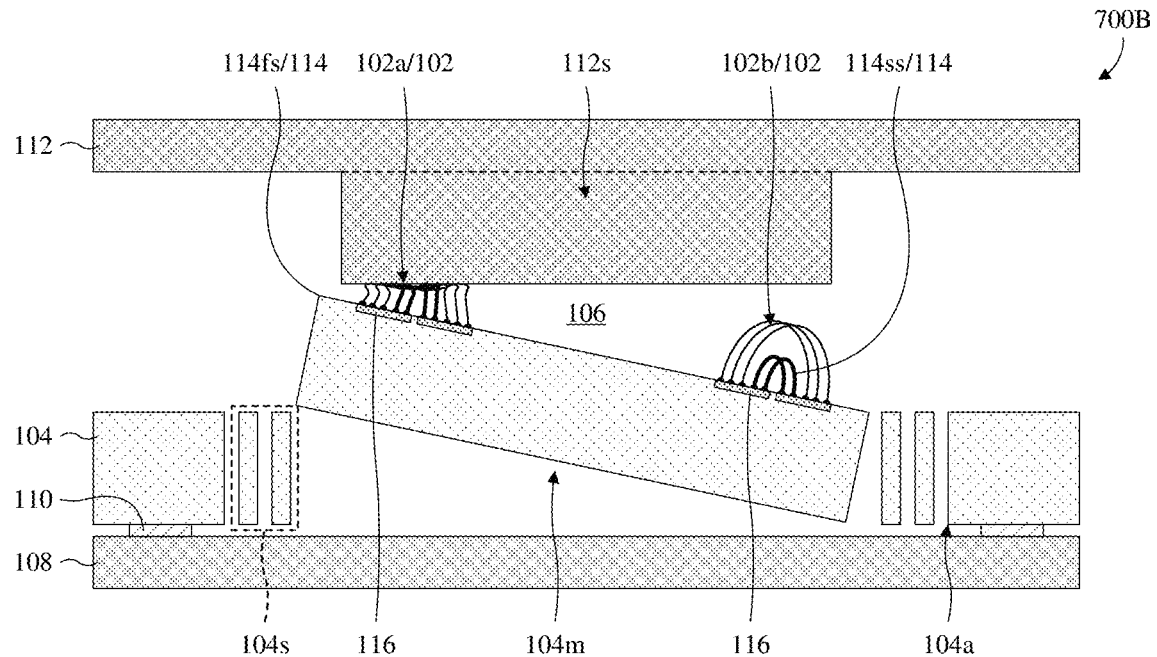

Because of the second-stage OoP damper wires 114*ss* have a lesser height and a greater cross-sectional area than the first-stage OoP damper wires 114*fs*, the second-stage OoP damper wires 114*ss* are more rigid than the first-stage OoP damper wires 114*fs*. If the movable mass 104*m* undergoes a sudden shock that moves the movable mass 104*m* towards the housing structure 112, one or both of the OoP wire-bond dampers 102 may come into contact with the housing structure 112 and may absorb kinetic energy of the movable mass 104*m*. If the sudden shock is less than a threshold amount (e.g., is mild), the first-stage OoP damper wires 114*fs* may fully absorb the kinetic energy. If the sudden shock exceeds the threshold amount (e.g., is extreme), the first-stage OoP damper wires 114*fs* may be unable to fully absorb the kinetic energy. Hence, the second-stage OoP damper wires 114*ss* may absorb a remainder of the kinetic energy. FIG. 7A provides a cross-sectional view 700A of some embodiments of the MEMS package of FIG. 6 in which first-stage OoP damper wires 114*fs* come into contact with the housing structure 112 and absorb kinetic energy. Further, FIG. 7B provides a cross-sectional view 700B of some embodiments of the MEMS package of FIG. 6 in which both first-stage OoP damper wires 114*fs* and second-stage OoP damper wires 114*ss* come into contact with the housing structure 112 and absorb kinetic energy.

By absorbing the kinetic energy, the OoP wire-bond dampers 102 may dampen the sudden shock and may prevent the movable mass 104*m* from colliding with the housing structure 112. This may, in turn, prevent damage to the movable mass 104*m*. Further, by increasing rigidity from the first-stage OoP damper wires 114*fs* to the second-stage OoP damper wires 114*ss*, damping is softer when the sudden shock is less than the threshold amount than when the sudden shock is more than the threshold amount. The softer damping may, in turn, reduce the likelihood of damage to the movable mass 104m.

In some embodiments, the first height Hfs and the second height Hss are as the height H of FIG. 1 is described, except that the first height Hfs is greater than the second height Hss. In some embodiments, the first height Hfs is about 200-300 micrometers, whereas the second height Hss is about 50-150 micrometers or about 150-200 micrometers. In other embodiments, the first height Hfs is about 150-200 micrometers, whereas the second height Hss is about 50-150 micrometers. Further, in other embodiments, the first height Hfs and the second height Hss have some other suitable values. In some embodiments, the second-stage OoP damper wires 114ss arch between the same OoP damper pads 116 as the neighboring first-stage OoP damper wires 114fs. In alternative embodiments, the second-stage OoP damper wires 114ss arch between different OoP damper pads 116 as the neighboring first-stage OoP damper wires 114fs.

While the OoP wire-bond dampers 102 are illustrated with two stages, the OoP wire-bond dampers 102 may have one or more additional stages of damping in alternative embodiments of the OoP wire-bond dampers 102. For example, the OoP wire-bond dampers 102 may have three stages of damping and may hence comprise individual pluralities of third-stage OoP damper wires formed by wire bonding. The third-stage OoP damper wires may underlie the second-stage OoP damper wires 114ss. Further, the third-stage OoP damper wires may be more rigid than the second-stage OoP damper wires 114ss and may have lesser heights than the second-stage OoP damper wires 114ss.

Figure 8:
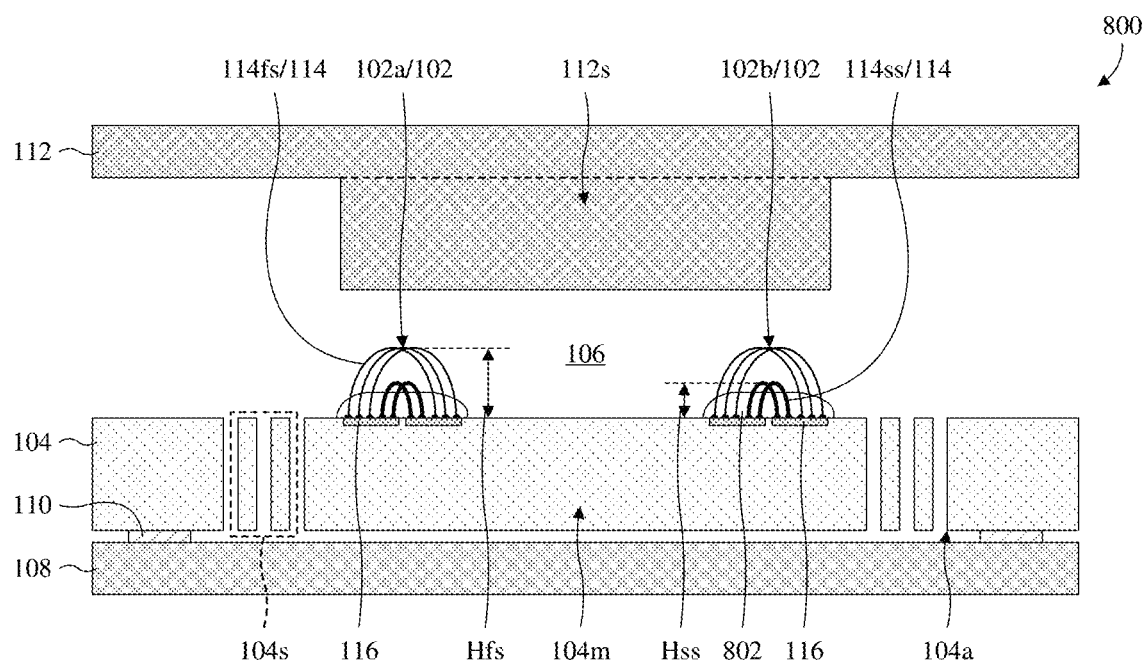
FIG. 8 provides a cross-sectional view of some alternative embodiments of the OoP wire-bond damper of FIG. 6 in which an epoxy layer surrounds the OoP wire-bond damper.

With reference to FIG. 8, a cross-sectional view 800 of some alternative embodiments of the OoP wire-bond dampers 102 of FIG. 6 is provided in which epoxy layers 802 respectively surround bases of the OoP wire-bond dampers 102. The epoxy layers 802 enhance strength of the OoP damper wires 114 and may therefore prevent over deformation of the OoP damper wires 114 when sudden shock brings the OoP wire-bond dampers 102 into contact with the housing structure 112.

Figure 9:
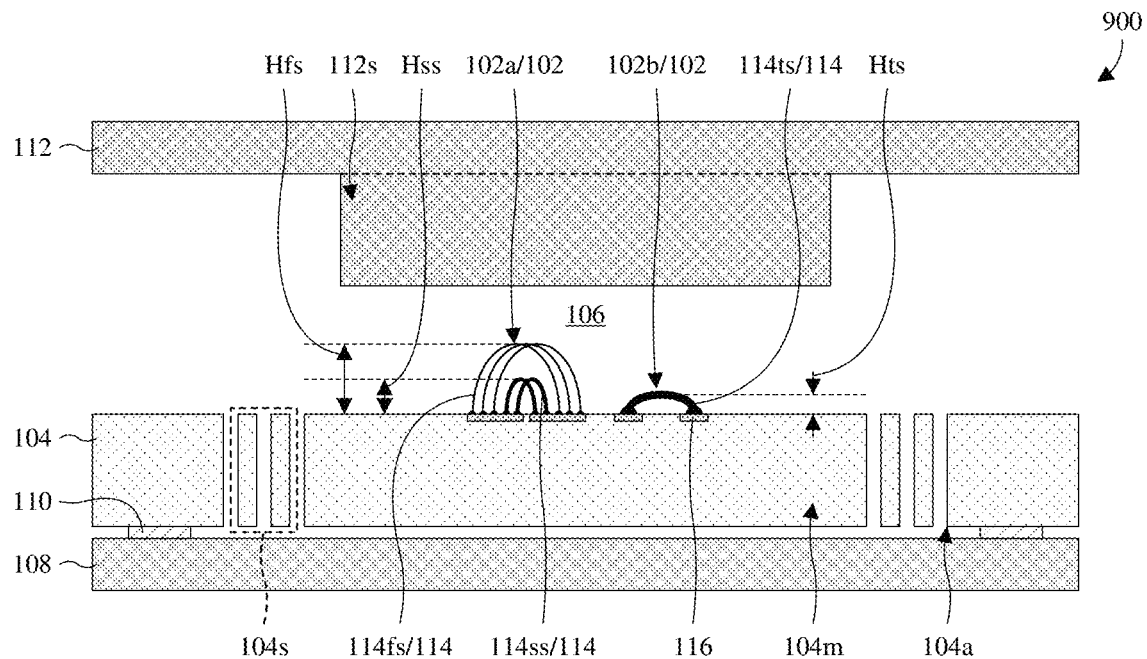
FIGS. 9 and 10 provide cross-sectional views of some alternative embodiments of the MEMS package of FIG. 1 in which the MEMS package has multiple OoP wire-bond dampers with different configurations.

With reference to FIG. 9, a cross-sectional view 900 of some alternative embodiments of the MEMS package of FIG. 6 is provided in which the first and second OoP wire-bond dampers 102a, 102b are at a center of the movable mass 104m and coordinate to define three stages of damping. The first OoP wire-bond damper 102a defines a first damping stage and a second damping stage as described with regard to FIG. 6. Further, the second OoP wire-bond damper 102b defines a third damping stage. Hence, the first OoP wire-bond damper 102a may be regarded as a multi-stage damper, whereas the second OoP wire-bond damper 102b may be regarded as a single-stage damper.

The first OoP wire-bond damper 102a comprises a plurality of first-stage OoP damper wires 114fs and further comprise a plurality of second-stage OoP damper wires 114ss. The first-stage OoP damper wires 114fs and the second-stage OoP damper wires 114ss are as described with regard to FIG. 6. The second OoP wire-bond damper 102b comprises a third-stage OoP damper wire 114ts formed by wire bonding. In alternative embodiments, the second OoP wire-bond damper 102b comprises more third-stage OoP damper wires 114ts. The third-stage OoP damper wire 114ts has a third height Hts less than the second height Hss of the second-stage OoP damper wires 114ss. Further, the third-stage OoP damper wire 114ts has a cross-sectional profile with a greater area than the second-stage OoP damper wires 114ss. For example, when the third-stage OoP damper wire 114ts and the second-stage OoP damper wires 114ss have circular cross-sections, the third-stage OoP damper wire 114ts has a greater diameter than the second-stage OoP damper wires 114ss. Because of the third-stage OoP damper wires 114ts have a lesser height and a greater cross-sectional area than the second-stage OoP damper wires 114ss, the third-stage OoP damper wires 114ts are more rigid.

In some embodiments, the first height Hfs, the second height Hss, and the third height Hts are as the height H of FIG. 1 is described, except that the first height Hfs is greater than the second height Hss and the second height Hss is greater than the third height Hts. In some embodiments, the first height Hfs is about 200-300 micrometers, the second height Hss is about 150-200 micrometers, and the third height Hts is about 50-150 micrometers. In other embodiments, the first height Hfs, the second height Hss, the third height Hts, or any combination of the foregoing has/have some other suitable values.

Figure 10:
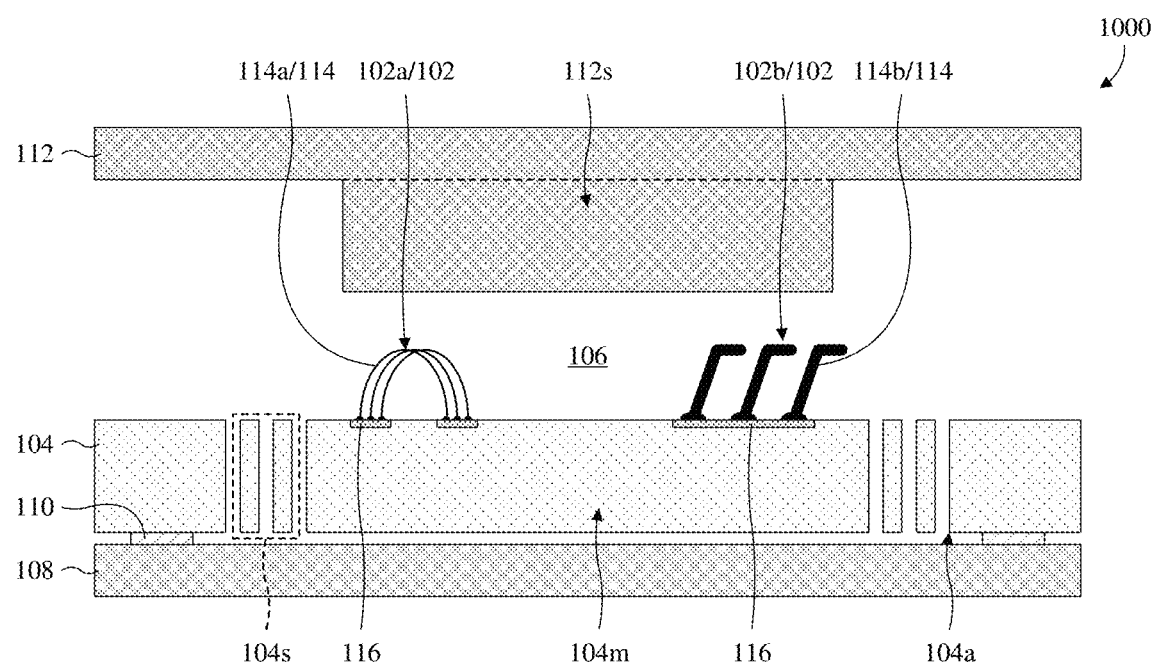

With reference to FIG. 10, a cross-sectional view 1000 of some alternative embodiments of the MEMS package of FIG. 1 is provided in which the first and second OoP wire-bond dampers 102a, 102b have different configurations. The OoP damper wires 114 of the first OoP wire-bond damper 102a arch between corresponding OoP damper pads 116 and may hence be regarded as loop-type wires. Further, the OoP damper wires 114 of the first OoP wire-bond dampers 102a have circular cross sections. In alternative embodiments, the OoP damper wires 114 of the first OoP wire-bond dampers 102a have some other suitable cross sections. The first OoP wire-bond damper 102a may, for example, be as described with regard to FIGS. 1-3.

The OoP damper wires 114 of the second OoP wire-bond damper 102b have first ends affixed to a corresponding OoP damper pad 116 and have second ends, respectively opposite the first ends, that are elevated above and spaced from the movable mass 104m. Further, the OoP damper wires 114 of the second OoP wire-bond damper 102b are ribbon-type wires and hence have rectangular cross sections from the first ends to the second ends. In alternative embodiments, the OoP damper wires 114 of the second OoP wire-bond damper 102b have some other suitable cross sections. The second OoP wire-bond damper 102b may, for example, be as described with regard to FIGS. 4 and 5.

Figure 11:
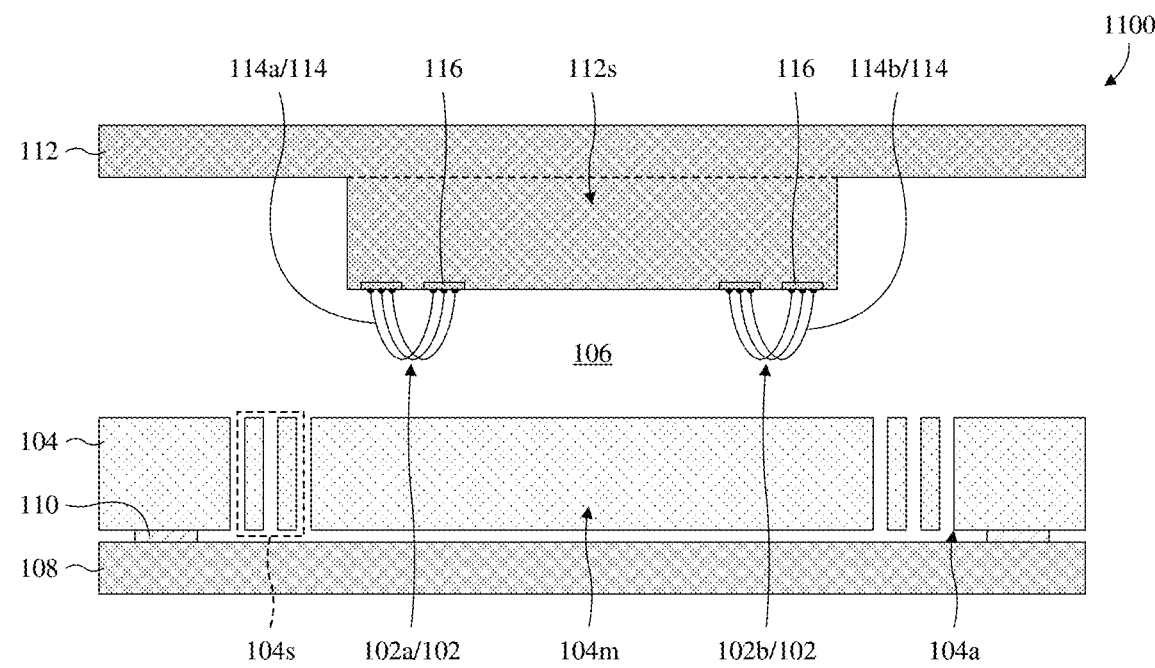
FIG. 11 provides a cross-sectional view of some alternative embodiments of the MEMS package of FIG. 1 in which the OoP wire-bond damper is spaced from a movable mass.

With reference to FIG. 11, a cross-sectional view 1100 of some alternative embodiments of the MEMS package of FIG. 1 is provided in which the OoP wire-bond dampers 102 are on the housing structure 112, spaced from the movable mass 104m. If the movable mass 104m moves too close to the housing structure 112 from sudden shock, the movable mass 104m comes into contact with one or both of the OoP wire-bond dampers 102. The OoP wire-bond dampers 102 then absorb kinetic energy of the movable mass 104m to dampen the shock and prevent damage to the movable mass 104m.

Figure 12A:
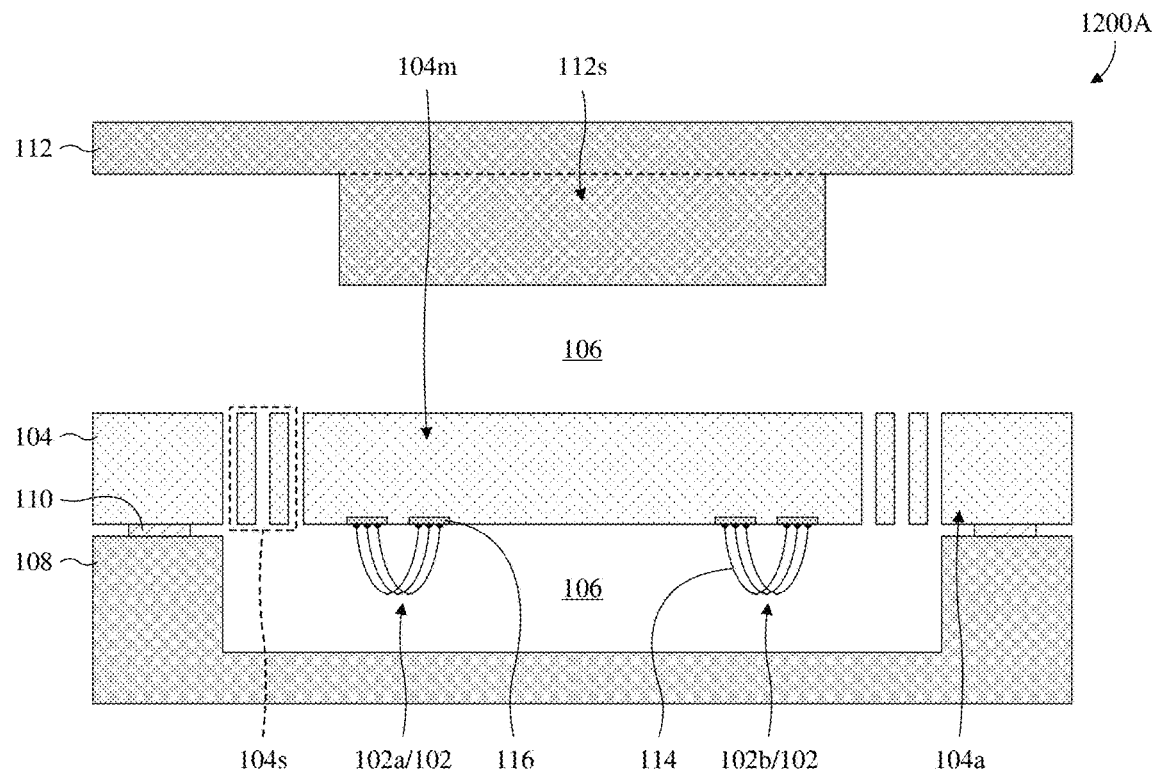
FIGS. 12A and 12B provide cross-sectional views of some alternative embodiments of the MEMS package of FIG. 1 in which the OoP wire-bond damper underlies a movable mass.
Figure 12B:
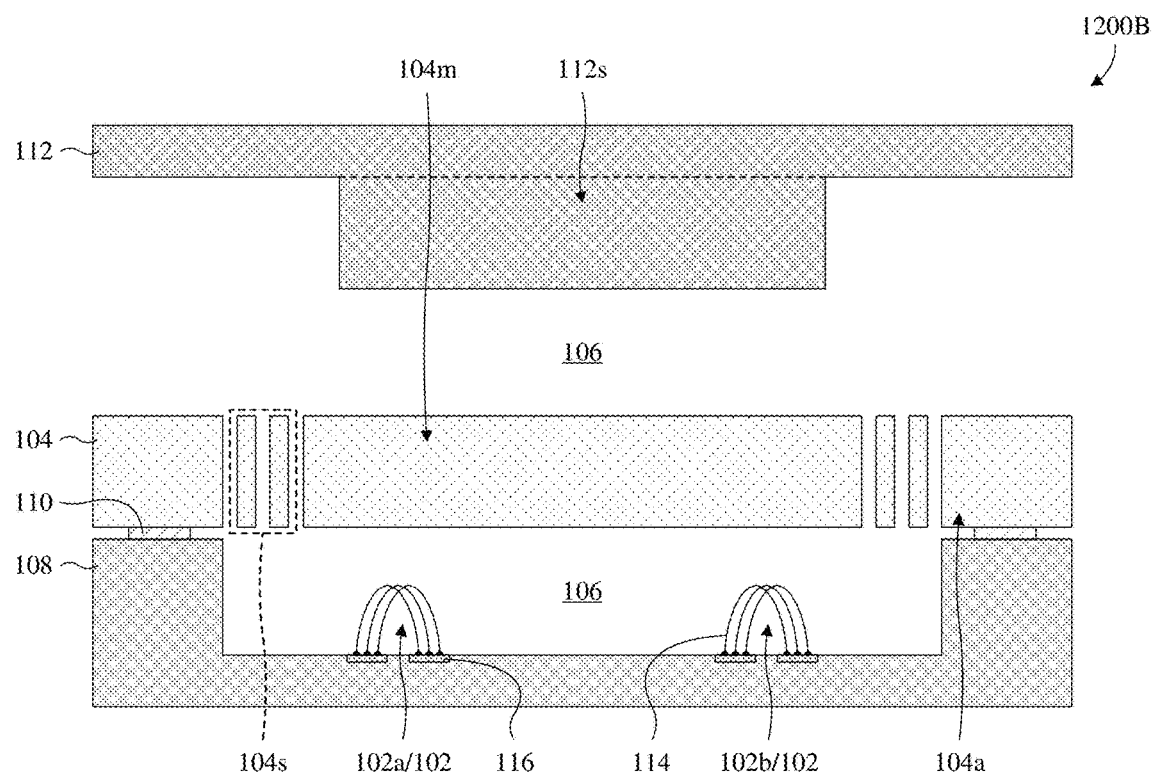

With reference to FIGS. 12A and 12B, cross-sectional views 1200A and 1200B of some alternative embodiments of the MEMS package of FIG. 1 are provided in which the OoP wire-bond dampers 102 underlie the movable mass 104m. The support substrate 108 has a top recess underlying the movable mass 104m and further defining the cavity 106. In alternative embodiments, the support substrate 108 has a planar profile (e.g., no top recess) and a thickness of the spacer dielectric layer 110 is increased. In FIG. 12A, the OoP wire-bond dampers 102 are on the movable mass 104m and extend downward. In FIG. 12B, the OoP wire-bond dampers 102 are on the support substrate 108 and extend upward.

Figure 13:
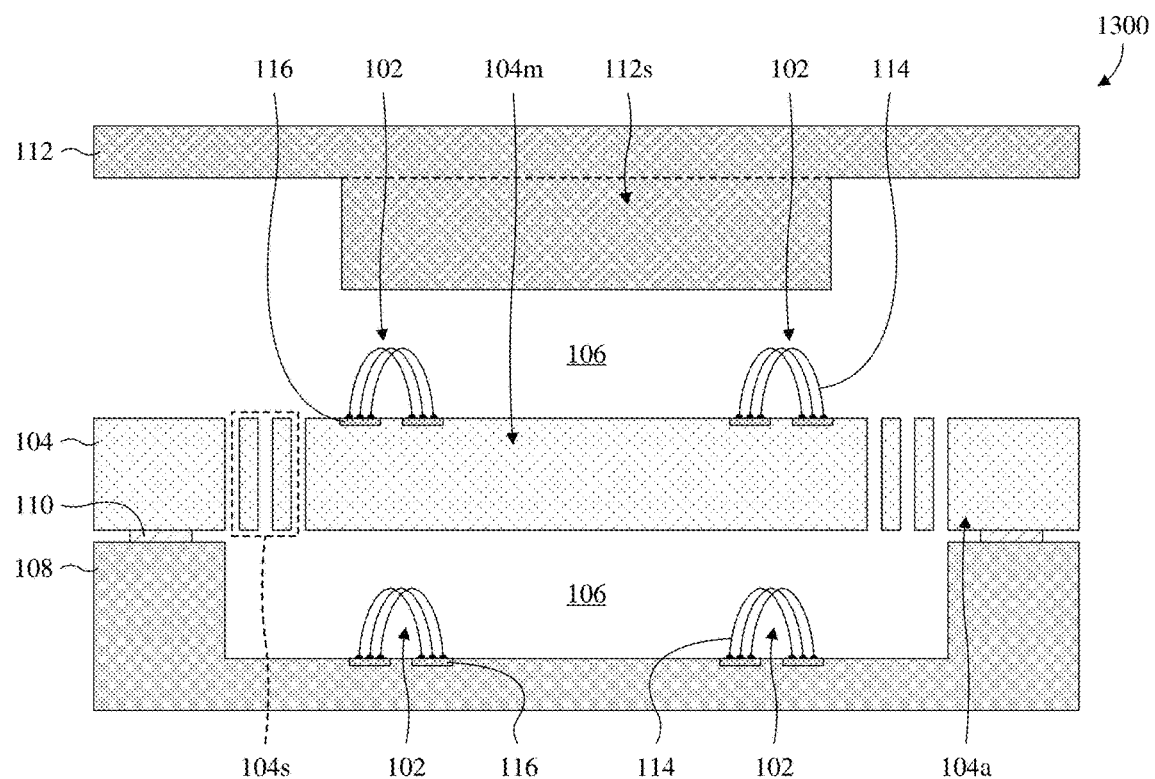
FIG. 13 provides a cross-sectional view of some alternative embodiments of the MEMS package of FIG. 1 in which OoP wire-bond dampers respectively overlie and underlie a movable mass.

With reference to FIG. 13, a cross-sectional view 1300 of some alternative embodiments of the MEMS package of FIG. 1 is provided in which the OoP wire-bond dampers 102 respectively overlie and underlie the movable mass 104m. The OoP wire-bond dampers 102 overlying the movable mass 104m are on the movable mass 104m, and the OoP wire-bond dampers 102 underlying the movable mass 104m are spaced from the movable mass 104m on the support substrate 108. In alternative embodiments, the OoP wire-bond dampers 102 overlying the movable mass 104m are on the housing structure 112 as in FIG. 11 and/or the OoP wire-bond dampers 102 underlying the movable mass 104m are on the movable mass 104m as in FIG. 12A.

Figure 14:
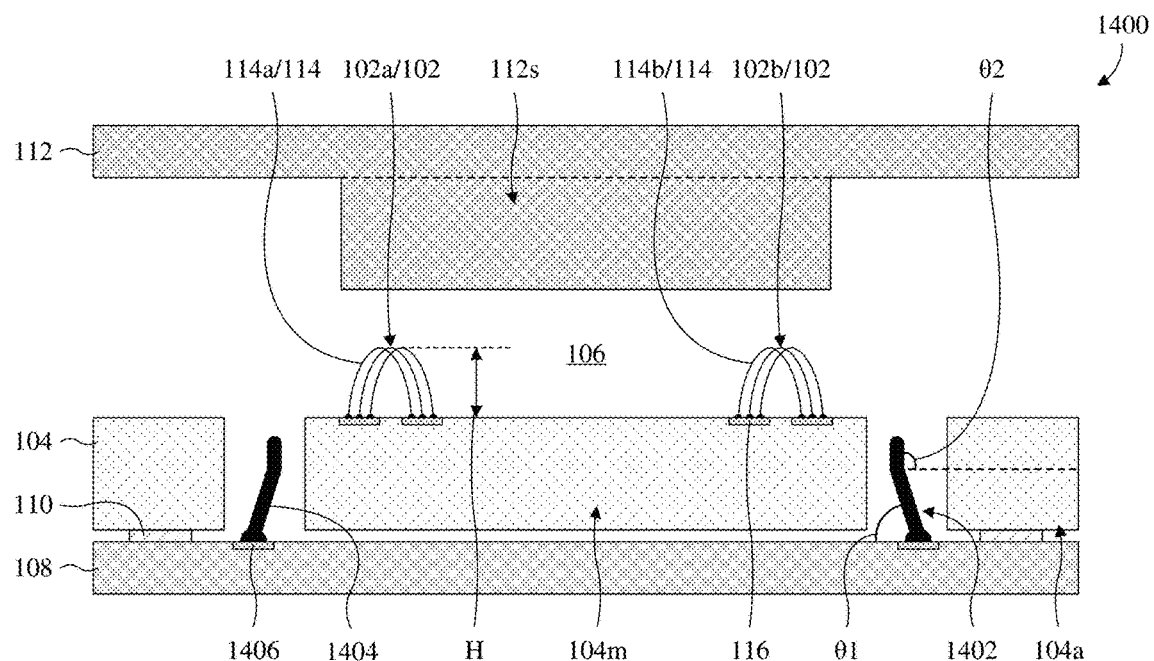
FIG. 14 provides a cross-sectional view of some alternative embodiments of the MEMS package of FIG. 1 in which the MEMS package comprises an in-plane wire-bond damper.

With reference to FIG. 14, a cross-sectional view 1400 of some alternative embodiments of the MEMS package of FIG. 1 is provided in which the MEMS package comprises a plurality of in-plane wire-bond dampers 1402 for damping in-plane motion. In-plane motion corresponds to motion within and/or along a plane along which the MEMS structure 104 is elongated. Hence, in-plane motion may be lateral (e.g., left-right) motion within the cross-sectional view 1400 of FIG. 14.

The in-plane wire-bond dampers 1402 are respectively on opposite sides of the movable mass 104m and are at sides of the movable mass 104m, laterally between the movable mass 104m and the anchor 104a. While the springs (see, e.g., 104s in FIG. 1) are not illustrated, it is to be appreciated that the springs persist outside the cross-sectional view 1400 of FIG. 14. The in-plane wire-bond dampers 1402 comprise individual in-plane damper wires 1404 formed by wire bonding. As illustrated, the in-plane wire-bond dampers 1402 each have a single in-plane damper wire 1404. However, in alternative embodiments, the in-plane wire-bond dampers 1402 each have more in-plane damper wires 1404. The in-plane damper wires 1404 have first ends affixed respectively to in-plane damper pads 1406 that are inset into a top of the support substrate 108. Further, the in-plane damper wires 1404 have second ends, respectively opposite the first ends, that are elevated above and are spaced from the support substrate 108. The in-plane damper wires 1404 are ribbon-type wires. As such, the in-plane damper wires 1404 have rectangular cross sections from the first ends to the second ends respectively opposite the first send. FIG. 5 provides a perspective view of a ribbon-type wire.

In some embodiments, each of the in-plane damper wires 1404 has a first segment and a second segment arranged end to end. The first segment extends from the support substrate 108 at a first angle θ1 relative to a top surface of the support substrate 108. The second segment extends from the first segment orthogonal to the top surface of the support substrate 108 or at a second angle θ2 relative to the top surface that is greater than the first angle θ1.

Figure 15:
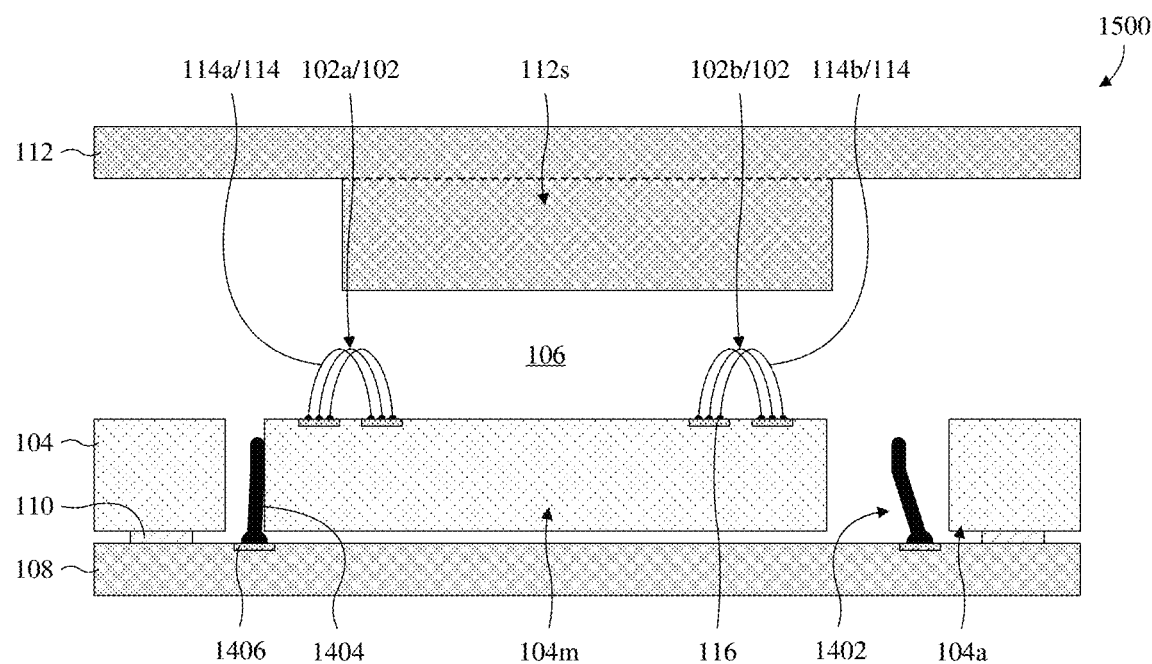
FIG. 15 provides a cross-sectional view of some embodiments of the MEMS package of FIG. 14 in which the in-plane wire-bond damper is absorbing shock.

If the movable mass 104m undergoes a sudden shock that moves the movable mass 104m towards one of the in-plane wire-bond dampers 1402, the one of the in-plane wire-bond dampers 1402 may come into contact with the movable mass 104m and may absorb kinetic energy of the movable mass 104m. FIG. 15 provides a cross-sectional view 1500 of some embodiments of the MEMS package of FIG. 14 in which one of the in-plane wire-bond dampers 1402 comes into contact with the movable mass 104m and absorbs kinetic energy of the movable mass 104m. By absorbing the kinetic energy, the in-plane wire-bond dampers 1402 may dampen the sudden shock and may prevent the movable mass 104m from colliding with the anchor 104a or otherwise overextending the springs (see, e.g., 104s in FIG. 1). This may, in turn, prevent damage to the movable mass 104m and/or the springs.

With reference to FIGS. 16A-16F, top layout views 1600A-1600F for some alternative embodiments of an OoP wire-bond damper 102 of FIG. 1 is provided. The OoP wire-bond damper 102 is representative of any one or each of the OoP wire-bond dampers 102 of FIG. 1 and is hence not specifically identified as either the first or second OoP wire-bond damper 102a, 102b of FIG. 1.

Figure 16A:
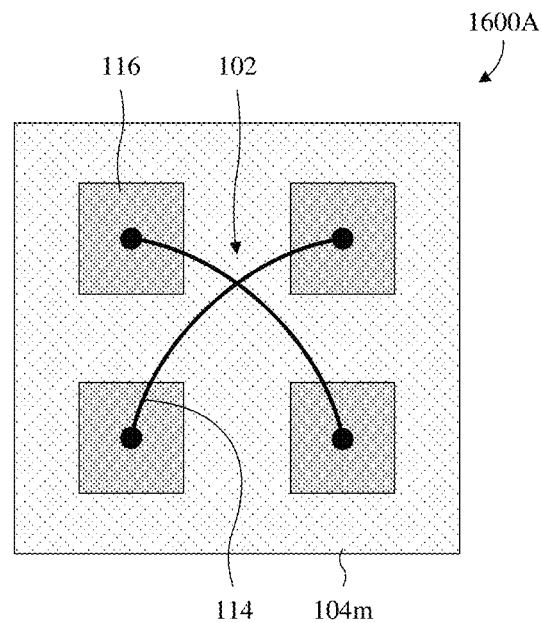
FIGS. 16A-16F provide top layout views for some alternative embodiments of the OoP wire-bond damper of FIG. 1.

In FIG. 16A, OoP damper pads 116 are in two rows and two columns. The rows extend horizontally (e.g., left to right), and the columns extend vertically (e.g., top to bottom), or vice versa. Further, a pair of OoP damper wires 114 is on the OoP damper pads 116. The OoP damper wires 114 cross each other and each of the OoP damper wires 114 arches or otherwise extends between diagonally opposite OoP damper pads 116.

Figure 16B:
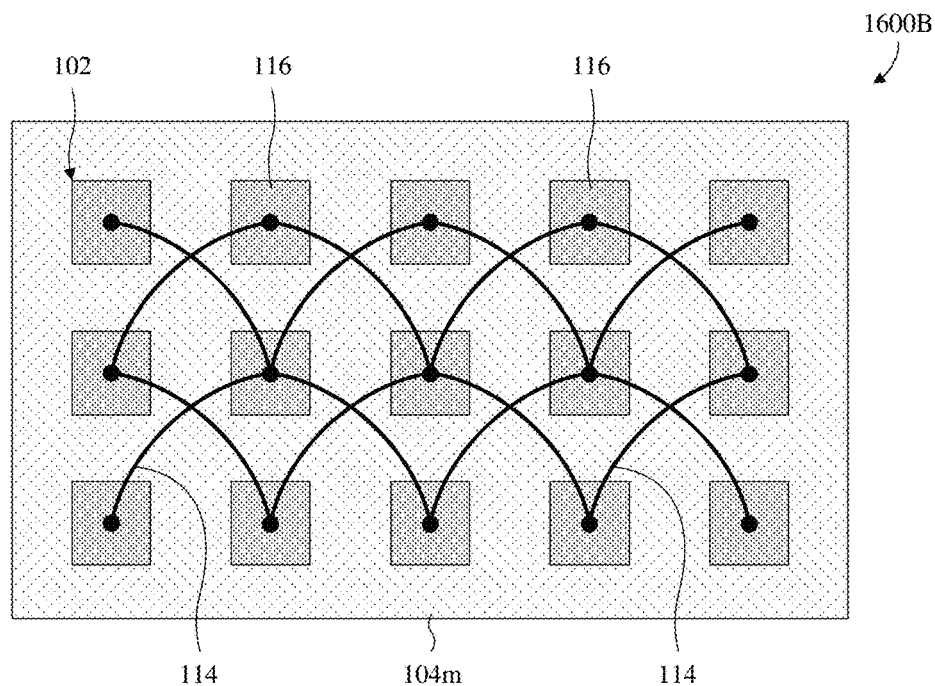

In FIG. 16B, the pattern of FIG. 16A repeats for more rows of OoP damper pads 116 and more columns of OoP damper pads 116. For example, the pattern of FIG. 16A repeats for three rows and five columns. In alternative embodiments, the pattern of FIG. 16B repeats for more or less rows of OoP damper pads 116 and/or more or less columns of OoP damper pads 116.

Figure 16C:
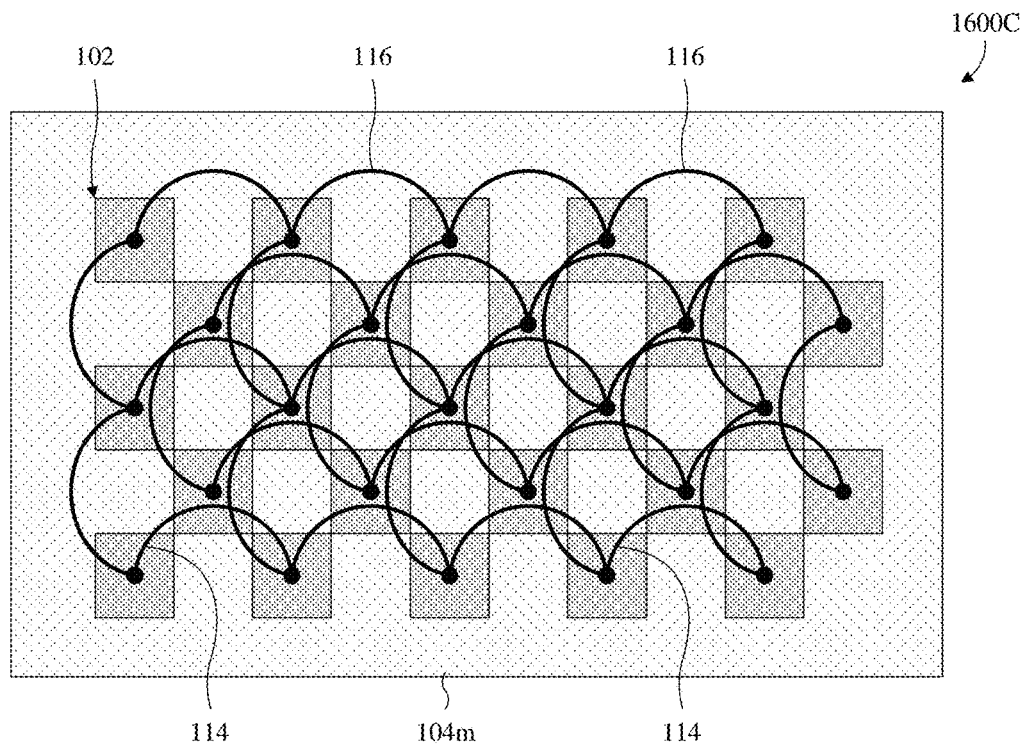

In FIG. 16C, OoP damper pads 116 are in a checkered pattern and are interconnected by OoP damper wires 114. The OoP damper wires 114 arch or otherwise extend horizontally between horizontally neighboring OoP damper pads 116 and further arch or otherwise extend vertically between vertically neighboring OoP damper pads 116.

Figure 16D:
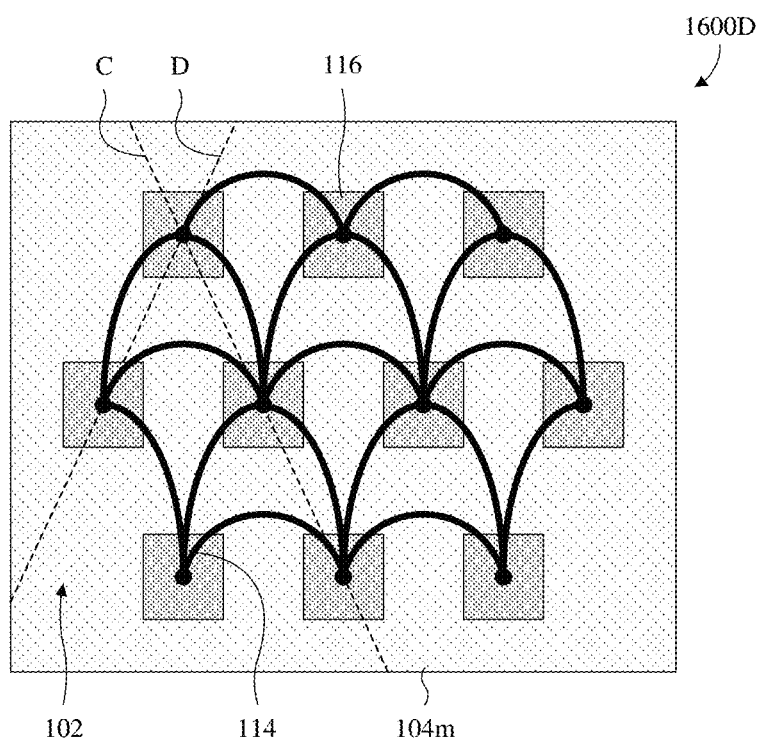

In FIG. 16D, OoP damper pads 116 are arranged in crossed lines (e.g., lines C and D) similar to a checkered pattern. However, the OoP damper pads 116 are spaced along the crossed lines. Further, the OoP damper wires 114 arch or otherwise extend horizontally between horizontally neighboring OoP damper pads 116 and further arch or otherwise extend diagonally between diagonally neighboring OoP damper pads 116.

Figure 16E:
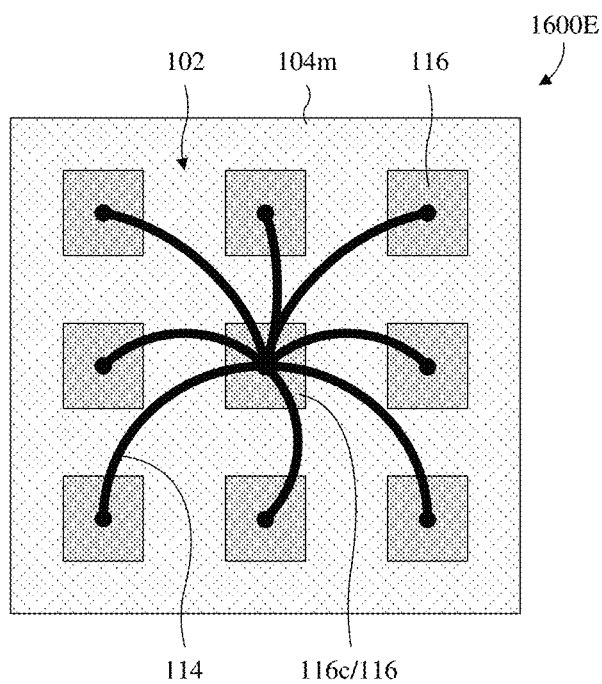

In FIG. 16E, OoP damper pads 116 are in an odd number of rows and an odd number of columns. For example, the OoP damper pads 116 are in three rows and three columns. The rows extend horizontally (e.g., left to right), and the columns extend vertically (e.g., top to bottom), or vice versa. Further, OoP damper wires 114 arch or otherwise extend from a central OoP damper pad 116c to a remainder of the OoP damper pads 116. The OoP damper wires 114 of FIGS. 16A-16E may, for example, be as described with regard to FIG. 1 or some other suitable figure. Further, the OoP damper wires 114 of FIGS. 16A-16E may, for example, be surrounded by epoxy layers 802 as shown in FIG. 8.

Figure 16F:
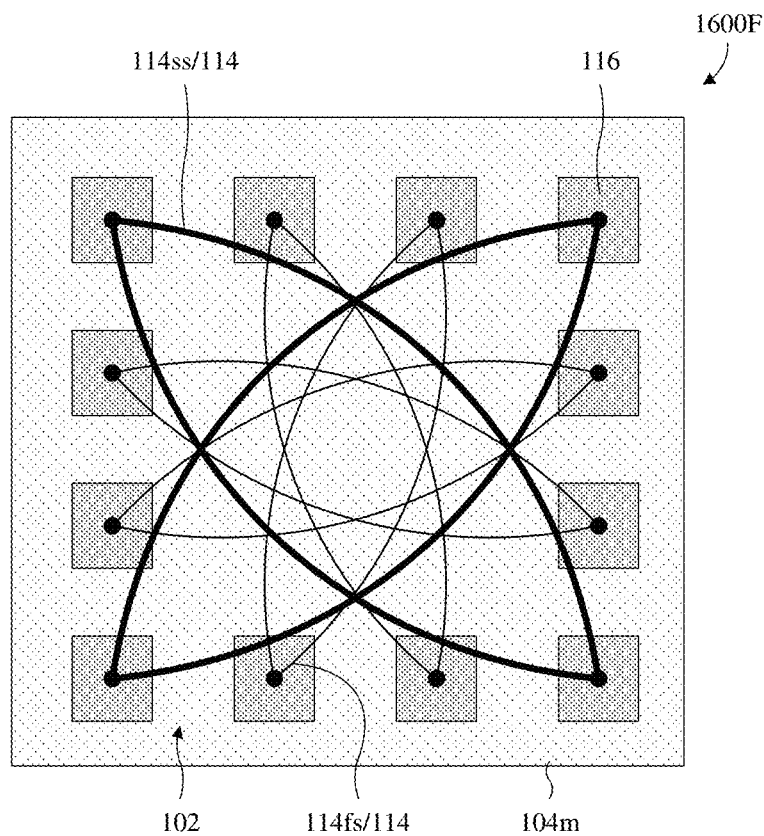

In FIG. 16F, OoP damper pads 116 are arranged in, and are spaced along, a square ring-shaped path. Further, pairs of OoP damper wires 114 arch or otherwise extend between diagonally opposite OoP damper pads 116 with an eye-shaped pattern. More particularly, pairs of second-stage OoP damper wires 114ss arch or otherwise extend in the eye-shaped pattern between diagonally opposite OoP damper pads 116 at corners of the square ring-shaped path. Further, pairs of first-stage OoP damper wires 114fs arch or otherwise extend in the eye-shaped pattern between diagonally opposite OoP damper pads 116 at a remainder of the square ring-shaped path. The first-stage OoP damper wires 114fs and the second-stage OoP damper wires 114ss may, for example, be as described with regard to FIG. 6 or some other suitable figure. Further, the OoP damper wires 114 of FIGS. 16A-16E may, for example, be surrounded by epoxy layers 802 as shown in FIG. 8.

Figure 17:
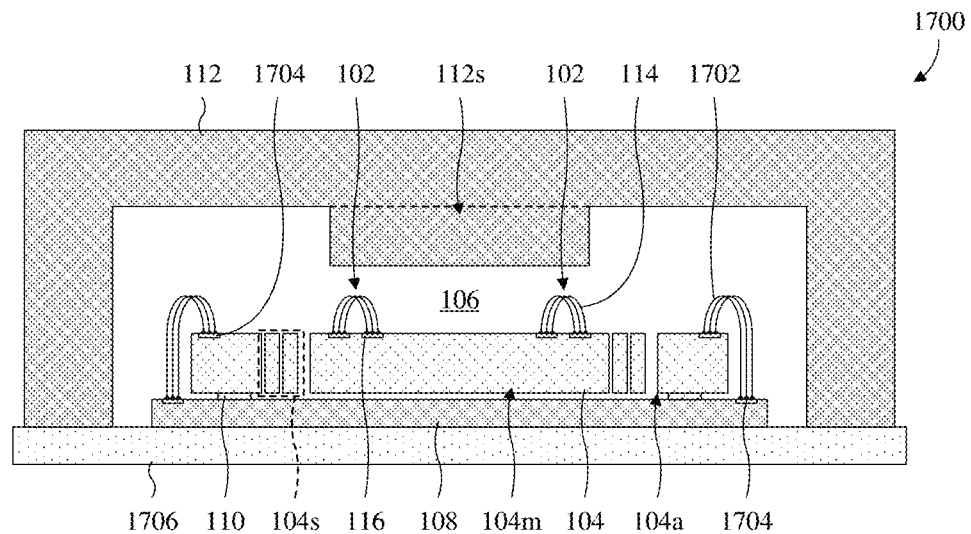
FIG. 17 provides an expanded cross-sectional view of some embodiments of the MEMS package of FIG. 1 in which peripheral detail is illustrated.

With reference to FIG. 17, an expanded cross-sectional view 1700 of some embodiments of the MEMS package of FIG. 1 is provided in which peripheral detail is illustrated. Interconnect wires 1702 are formed by wire bonding and extend between interconnect pads 1704 respectively on the MEMS structure 104 and the support substrate 108. The interconnect wires 1702 and the interconnect pads 1704 are conductive and may, for example, be respectively as the OoP damper wires 114 and the OoP damper pads 116 are described with regard to FIG. 1.

A package substrate 1706 underlies the support substrate 108, and the housing structure 112 extends along sidewalls of the MEMS structure 104 and the support substrate 108 to the package substrate 1706. Collectively, the package substrate 1706 and the housing structure 112 seal the cavity 106.

The interconnect wires 1702 and the interconnect pads 1704 may, for example, facilitate electrical coupling to the MEMS structure 104 from the support substrate 108. Further, while not shown, the support substrate 108 and the package substrate 1706 may, for example, comprise vias and/or other conductive features to facilitate electrical coupling to the interconnect pads 1704 from outside the MEMS package or from other devices (e.g., an IC die or some other suitable device) within the MEMS package.

Figure 18:
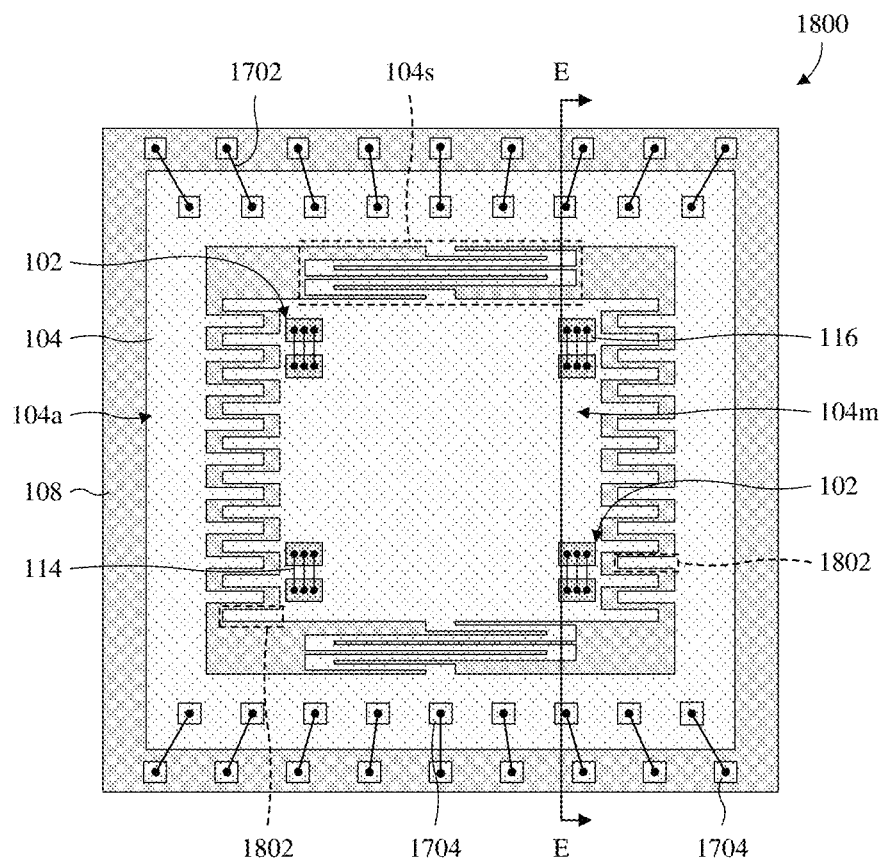
FIG. 18 provides a top layout view of some embodiments of a MEMS structure and a support substrate in FIG. 17.

With reference to FIG. 18, a top layout view 1800 of some embodiments of the MEMS structure 104 and the support substrate 108 in FIG. 17 is provided. The cross-sectional view 1700 of FIG. 17 may, for example, be taken along line E. The OoP wire-bond dampers 102 are respectively at the four corners of the movable mass 104*m* and comprise individual OoP damper wires 114 and individual OoP damper pads 116. In alternative embodiments, the OoP wire-bond dampers 102 are at different locations and/or the MEMS package has more or less wire-bond dampers.

The movable mass 104*m* is suspended by the springs 104*s*, which are respectively on first opposite sides of the movable mass 104*m*. Further, the springs 104*s* extend from the anchor 104*a* to the movable mass 104*m* respectively on the first opposite sides. The anchor 104*a* extends in a closed path to surround the movable mass 104*m*. The movable mass 104*m* and the anchor 104*a* have individual pluralities of fingers 1802. The pluralities of fingers 1802 are respectively on second opposite sides of the movable mass 104*m*. Further, the pluralities of fingers 1802 of the movable mass 104*m* are respectively interdigitated with the pluralities of fingers 1802 of the anchor 104*a* on the second opposite sides. In some embodiments, capacitive coupling between the fingers 1802 of the movable mass 104*m* with the fingers 1802 of the anchor 104*a* allows motion of the movable mass 104*m* to be measured.

Figure 19:
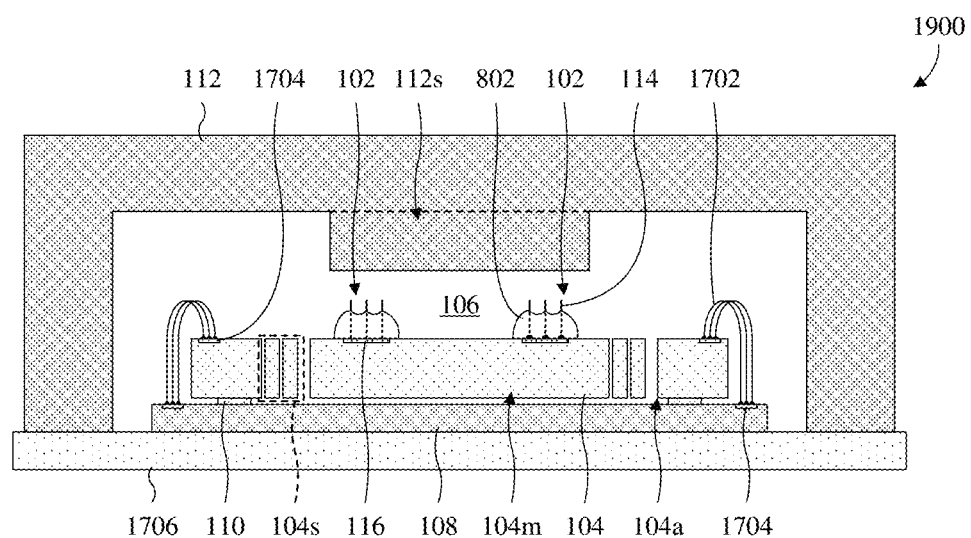
FIG. 19 provides a cross-sectional view of some alternative embodiments of the MEMS package of FIG. 17 in which an epoxy layer surrounds the OoP wire-bond damper.

With reference to FIG. 19, a cross-sectional view 1900 of some alternative embodiments of the MEMS package of FIG. 17 is provided in which the OoP damper wires 114 arch transverse (e.g., into and out of the page) to the cross-sectional view 1900. Further, epoxy layers 802 surround the OoP wire-bond dampers 102. As described above, the epoxy layers 802 enhance strength of the OoP damper wires 114 and may therefore prevent over deformation of the OoP damper wires 114 when the OoP wire-bond dampers 102 come into contact with the housing structure 112.

Figure 20:
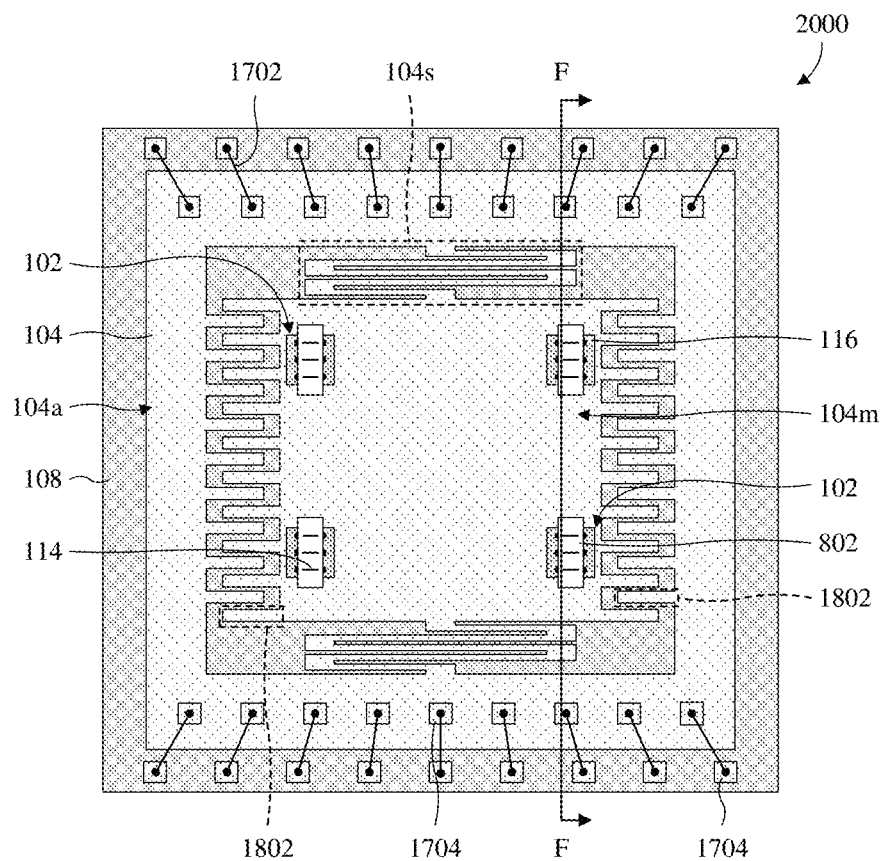
FIG. 20 provides a top layout view of some embodiments of a MEMS structure and a support substrate in FIG. 19.

With reference to FIG. 20, a top layout view 2000 of some embodiments of the MEMS structure 104 and the support substrate 108 in FIG. 19 is provided. The cross-sectional view 1900 of FIG. 19 may, for example, be taken along line F.

Figure 21:
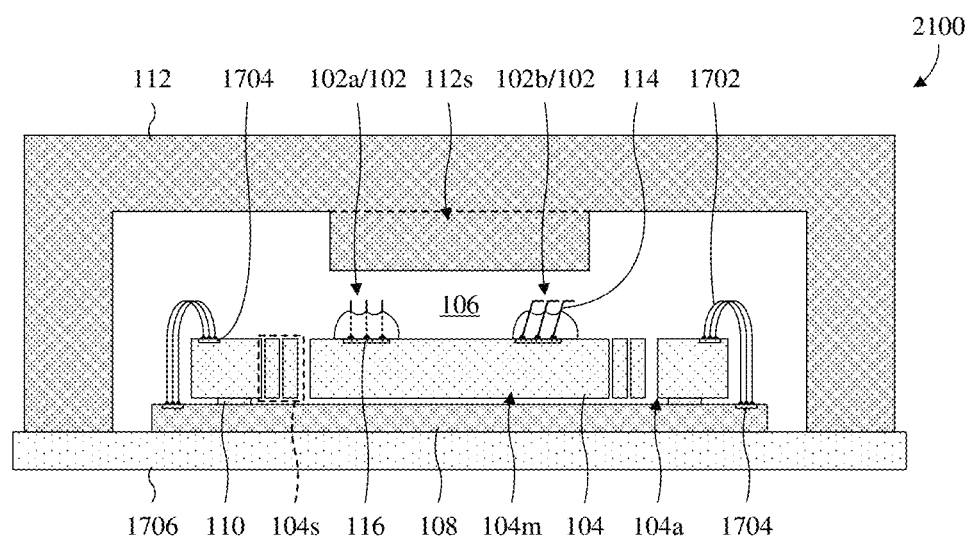
FIGS. 21 and 22 provide cross-sectional views of some alternative embodiments of the MEMS package of FIG. 19 in which the OoP wire-bond damper is varied.
Figure 22:
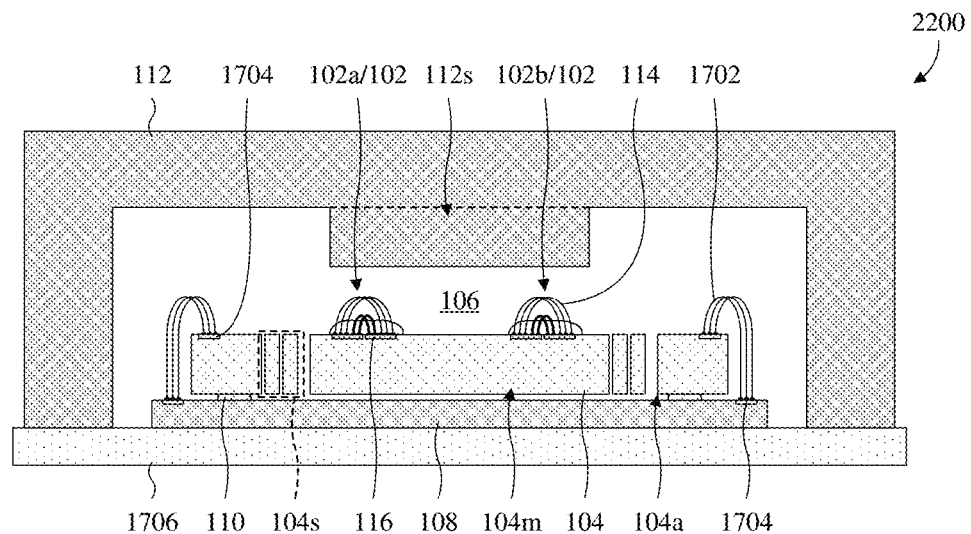

With reference to FIGS. 21 and 22, cross-sectional views 2100, 2200 of some alternative embodiments of the MEMS package of FIG. 19 is provided in which the OoP wire-bond dampers 102 are varied. In FIG. 21, a first OoP wire-bond damper 102*a* is as in FIG. 19, but a second OoP wire-bond damper 102*b* is a ribbon-type damper. As such, the OoP damper wires 114 of the second OoP wire-bond damper 102*b* have rectangular cross sections from the first ends on the movable mass 104*m* to the second ends respectively opposite the first ends. In FIG. 22, the first and second OoP wire-bond dampers 102*a*, 102*b* are multi-stage wire bond dampers.

Figure 23:
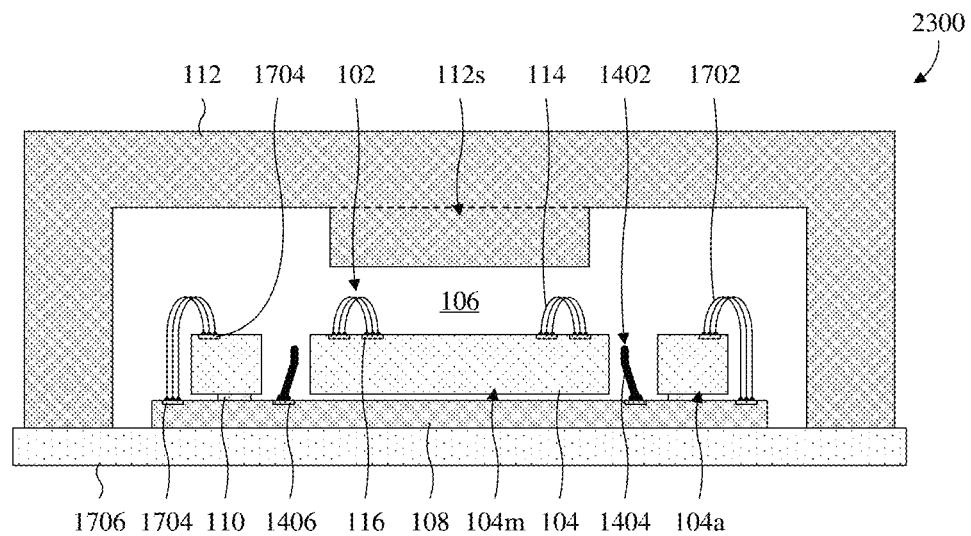
FIG. 23 provides a cross-sectional view of some alternative embodiments of the MEMS package of FIG. 17 in which the MEMS package comprises an in-plane wire-bond damper.

With reference to FIG. 23, a cross-sectional view 2300 of some alternative embodiments of the MEMS package of FIG. 17 is provided in which the MEMS package comprises a plurality of in-plane wire-bond dampers 1402. The in-plane wire-bond dampers 1402 are respectively on opposite sides of the movable mass 104*m* and are at sides of the movable mass 104*m*, laterally between the movable mass 104*m* and the anchor 104*a*. The in-plane wire-bond dampers 1402 may, for example, be as described with regard to FIGS. 14 and 15.

Figure 24:
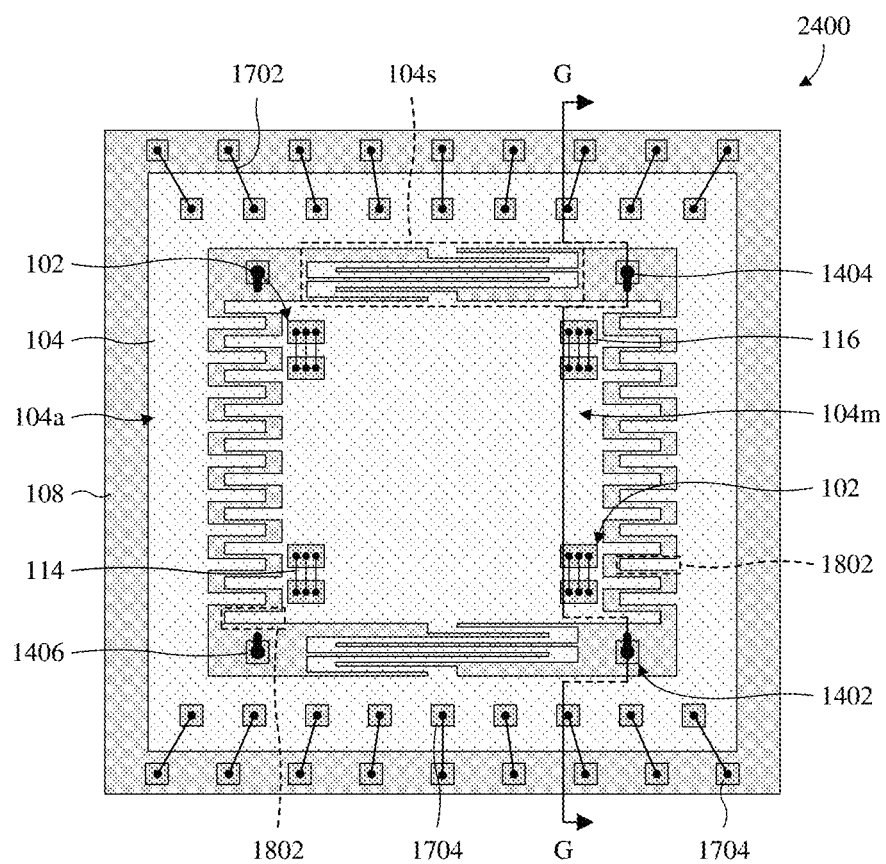
FIG. 24 provides a top layout view of some embodiments of a MEMS structure and a support substrate in FIG. 23.

With reference to FIG. 24, a top layout view 2400 of some embodiments of the MEMS structure 104 and the support substrate 108 in FIG. 23 is provided. The cross-sectional view 2300 of FIG. 23 may, for example, be taken along solid portions of line G, but not dashed portions of line G. The in-plane wire-bond dampers 1402 are at corners of the movable mass 104*m* and each have a single in-plane damper wire 1404. In alternative embodiments, the in-plane wire-bond dampers 1402 are at different locations and/or have more in-plane damper wires 1404.

Figure 25:
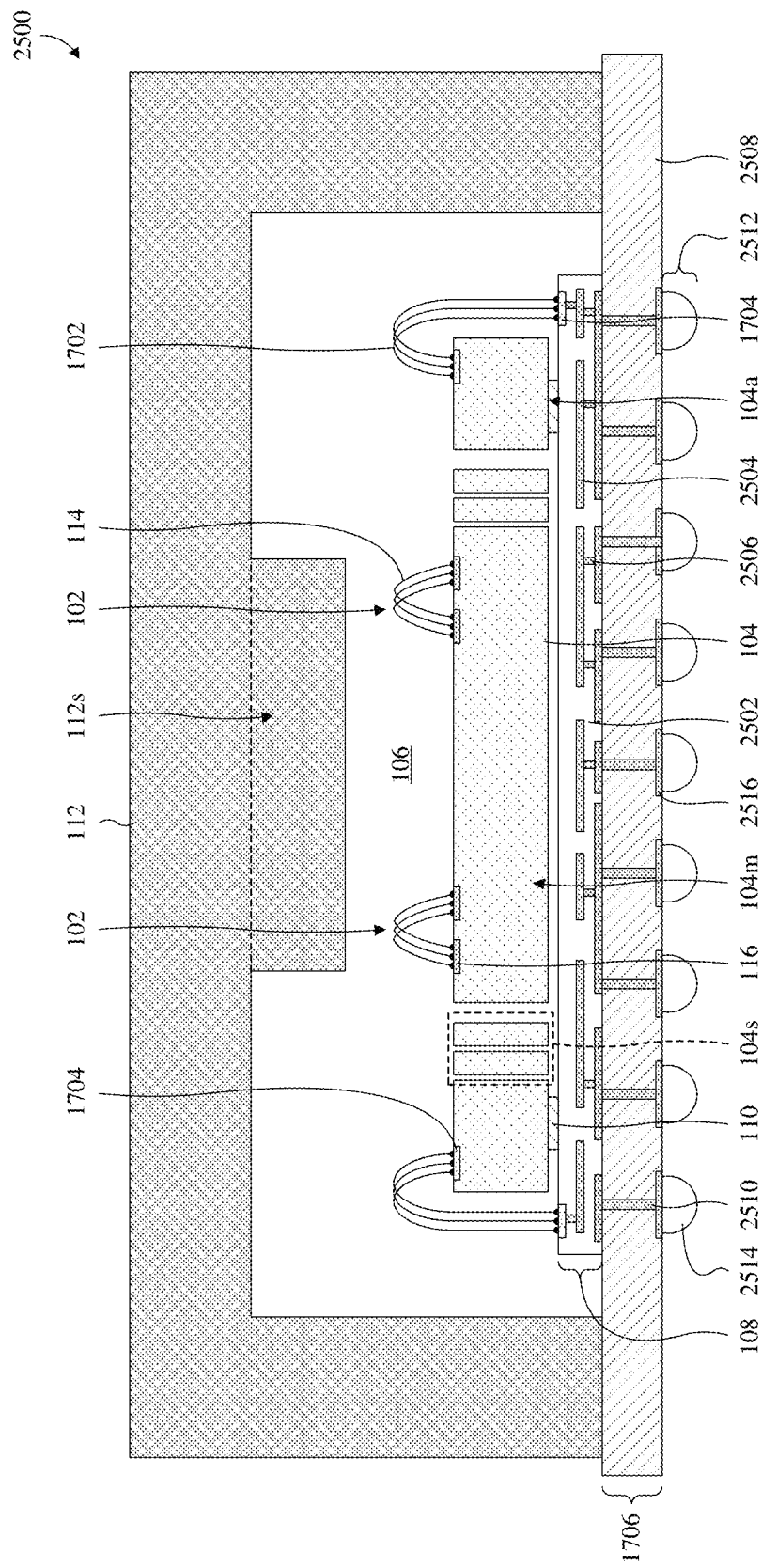
FIG. 25 provides a cross-sectional view of some embodiments of the MEMS package of FIG. 17 in which a support substrate and a package substrate are shown in greater detail.

With reference to FIG. 25, a cross-sectional view 2500 of some embodiments of the MEMS package of FIG. 17 is provided in which a support substrate 108 and a package substrate 1706 are shown in greater detail. The support substrate 108 comprises a support dielectric layer 2502, as well as a plurality of wires 2504 and a plurality of vias 2506. The wires 2504 and the vias 2506 are alternatingly stacked in the support dielectric layer 2502 to define conductive paths. The support dielectric layer 2502 may, for example, be or comprise a dielectric polymer and/or some other suitable material. The wires 2504 and the vias 2506 may, for example, be or comprise metal and/or some other suitable conductive material. In some embodiments, the support substrate 108 is a PCB or some other suitable type of substrate.

The package substrate 1706 comprises a package dielectric layer 2508 and a plurality of through vias 2510 extending through the package dielectric layer 2508 from the support substrate 108 to a ball grid array (BGA) 2512 under the package substrate 1706. The BGA 2512 comprises a plurality of solder balls 2514 electrically coupled to the through vias 2510 by under bump metallization (UBM) layers 2516. The package dielectric layer 2508 may, for example, be or comprise silicon oxide, a dielectric polymer, some other suitable material, or any combination of the foregoing. The through vias 2510 and the UBM layers 2516 may, for example, be or comprise metal and/or some other suitable conductive materials.

While FIG. 8 illustrates alternative embodiments of FIG. 6 in which the epoxy layers 802 surround the OoP wire-bond dampers 102, the OoP wire-bond dampers 102 in any of FIGS. 1-5, 9-11, 12A, 12B, 13-15, 16A-16F, 17, 23, and 25 may be surrounded by the epoxy layers 802 as shown in FIG. 8. While FIG. 11 illustrates alternative embodiments of FIG. 1 in which the OoP wire-bond dampers 102 are on the housing structure 112, the OoP wire-bond dampers 102 in any of FIGS. 4, 6, 8-10, 14, 15, 17, 19, 21-23, and 25 may be on the housing structure 112 as shown in FIG. 11. While FIGS. 12A and 12B illustrate alternative embodiments of FIG. 1 in which the OoP wire-bond dampers 102 underlie the movable mass, the OoP wire-bond dampers 102 in any of FIGS. 4, 6, 8-10, 14, 15, 17, 19, 21-23, and 25 may underlie the movable mass 104m as shown in any of FIGS. 12A and 12B. While FIG. 13 illustrates alternative embodiments of FIG. 1 in which the OoP wire-bond dampers 102 both overlie and underlie the movable mass, the OoP wire-bond dampers 102 in any of FIGS. 4, 6, 8-10, 14, 15, 17, 19, 21-23, and 25 may both overlie and underlie the movable mass 104m as shown in FIG. 13. While FIG. 14 illustrates alternative embodiments of FIG. 1 in which the MEMS package comprises the in-plane wire-bond dampers 1402, the MEMS package in any of FIGS. 4, 6, 8-11, 12A, 12B, 13, 17, 19, 21, 22, and 25 may comprise the in-plane wire-bond dampers 1402 as shown in FIG. 14. While FIGS. 16A-16F illustrate alternative embodiments of the OoP wire-bond dampers 102 of FIG. 1, the OoP wire-bond dampers 102 in any of FIGS. 4, 6, 8-11, 12A, 12B, 13-15, 17, 19, 21-23, and 25 may alternatively be as in any of FIGS. 16A-16F.

With reference to FIGS. 26-34, a series of cross-sectional views 2600-3400 of some embodiments of a method for forming a MEMS package comprising a wire-bond damper is provided. The method and variations thereof may, for example, be employed to form the MEMS package in any of FIGS. 1-11, 12A, 12B, 13-15, and 17-25.

Figure 26:
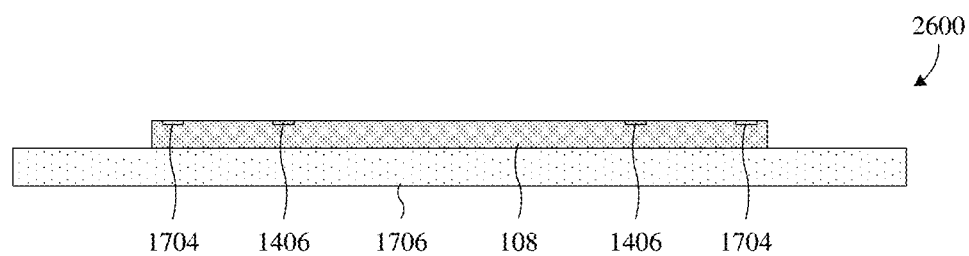
FIGS. 26-34 provide a series of cross-sectional views of some embodiments of a method for forming a MEMS package comprising an OoP wire-bond damper.

As illustrated by the cross-sectional view 2600 of FIG. 26, a support substrate 108 is arranged on and secured to a package substrate 1706. In other words, the support substrate 108 is mounted to the package substrate 1706. The support substrate 108 may, for example, be secured to the package substrate 1706 by an adhesive, by fusion bonding, or by some other suitable approach to mounting.

The support substrate 108 comprises a plurality of interconnect pads 1704 and a plurality of in-plane damper pads 1406 inset into a top of the support substrate 108. The interconnect pads 1704 are at a periphery of the support substrate 108, respectively on opposite sides of the support substrate 108. The in-plane damper pads 1406 are between the interconnect pads 1704 and are respectively on the opposite sides of the support substrate 108. The interconnect pads 1704 and the in-plane damper pads 1406 are conductive and may, for example, be or comprise metal and/or some other suitable conductive material. In some embodiments, the interconnect pads 1704 are directly connected to and/or electrically coupled to underlying conductive features (not shown). In some embodiments, the in-plane damper pads 1406 are electrically floating. Further, in some embodiments, the in-plane damper pads 1406 do not directly contact and/or electrically couple to underlying conductive features (not shown).

In some embodiments, the support substrate 108 is a PCB. FIG. 25 provides a non-limiting example of some of such embodiments. In other embodiments, the support substrate 108 is an IC die, a bulk substrate of silicon, or some other suitable type of substrate. In some embodiments, the package substrate 1706 comprises vias and/or other conductive features to facilitate electrical coupling from an underside of the package substrate 1706 to the support substrate 108. FIG. 25 provides a non-limiting example of some of such embodiments.

Figure 27:
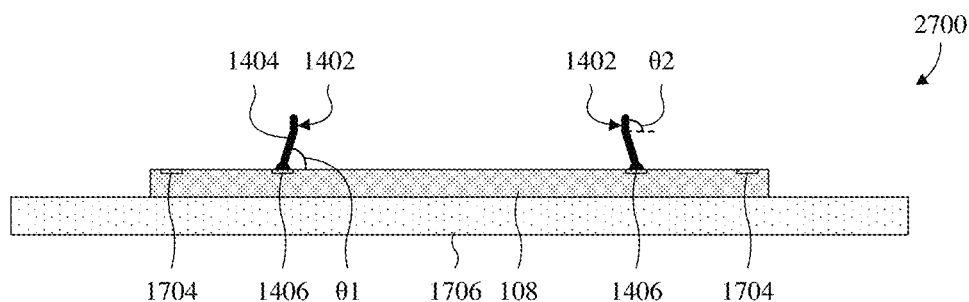

As illustrated by the cross-sectional view 2700 of FIG. 27, a first wire-bonding process is performed to form a plurality of in-plane wire-bond dampers 1402 respectively on the in-plane damper pads 1406. The in-plane wire-bond dampers 1402 comprise individual in-plane damper wires 1404. In some embodiments, the in-plane wire-bond dampers 1402 each have a single in-plane damper wire 1404. In alternative embodiments, the in-plane wire-bond dampers 1402 each have multiple in-plane damper wires 1404.

The in-plane damper wires 1404 are ribbon-type wires. As such, the in-plane damper wires 1404 have rectangular cross-sections extending from first ends of the in-plane damper wires 1404 to second ends of the in-plane damper wires 1404 respectively opposite the first ends. The first ends are affixed respectively to the in-plane damper pads 1406, and the second ends are spaced from and elevated above the support substrate 108. Non-limiting examples of ribbon-type wires are shown in FIG. 5. In some embodiments, the in-plane damper wires 1404 each have a first segment and a second segment arranged end to end. The first segment extends from the support substrate 108 at a first angle θ1 relative to a top surface of the support substrate 108, and the second segment extends from the first segment at a second angle θ2 larger than the first angle θ1 relative to the top surface of the support substrate 108. The in-plane damper wires 1404 may, for example, be or comprise silver, gold, copper, aluminum, or some other suitable metal.

Figure 28:
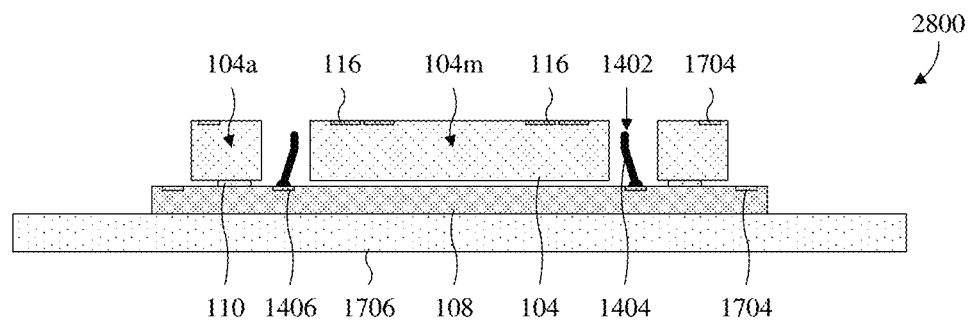

As illustrated by the cross-sectional view 2800 of FIG. 28, a MEMS structure 104 is formed. The MEMS structure 104 has an anchor 104a, a movable mass 104m, and a pair of springs (not shown). The anchor 104a is at a periphery of the MEMS structure 104 and has a pair of segments respectively on opposite sides of the movable mass 104m. The anchor 104a is fixed, and the movable mass 104m is movable relative to the anchor 104a. The springs are outside the cross-sectional view 2800, but non-limiting examples are shown by springs 104s in FIG. 24. The springs are respectively on the opposite sides of the movable mass 104m and extend to the movable mass 104m respectively from the segments of the anchor 104a to suspend the movable mass 104m and to facilitate movement of the movable mass 104m. The MEMS structure 104 may, for example, be a motion sensor structure, an OIS structure, a microphone structure, or some other suitable type of MEMS structure. In some embodiments, a top layout of the MEMS structure 104 is as shown in FIG. 24, such that the cross-sectional view 2800 may be taken along solid, not dashed, portions of line G in FIG. 24.

In some embodiments, the MEMS structure 104 is or comprises monocrystalline silicon, polycrystalline silicon, or some other suitable type of semiconductor material. In other embodiments, the MEMS structure 104 is or comprises a piezoelectric material or some other suitable type of material. In some embodiments, the MEMS structure 104 comprises conductive features. For example, a bulk of the MEMS structure 104 may be made up of silicon, a piezoelectric material, or some other suitable type of material, and the conductive features may be embedded therein. The conductive features may, for example, be metal wires, doped semiconductor regions, or other suitable types of conductive features.

A plurality of OoP damper pads 116 and a plurality of additional interconnect pads 1704 are inset into a top of the MEMS structure 104. The additional interconnect pads 1704 are at the anchor 104a, respectively on opposite sides of the MEMS structure 104. Further, the additional interconnect pads 1704 are electrically coupled to the movable mass 104m and/or to conductive features in the movable mass 104m by conductive wires and/or paths (not shown) extending from the additional interconnect pads 1704, through one or both of the springs, to the movable mass 104m and/or the conductive features. The OoP damper pads 116 are between the additional interconnect pads 1704, at the movable mass 104m, and respectively on the opposite sides. The additional interconnect pads 1704 and the OoP damper pads 116 are conductive and may, for example, be or comprise metal and/or some other suitable conductive material. In some embodiments, the OoP damper pads 116 are electrically floating.

Also illustrated by the cross-sectional view 2800 of FIG. 28, the MEMS structure 104 is arranged over and secured to the support substrate 108 through a spacer dielectric layer 110. In other words, the MEMS structure 104 is mounted to the support substrate 108. The MEMS structure 104 is mounted so the in-plane wire-bond dampers 1402 are respectively on opposite sides of the movable mass 104m, laterally between the anchor 104a and the movable mass 104m. In some embodiments, the MEMS structure 104 is secured to the package substrate 1706 by an adhesive, by fusion bonding, or by some other suitable approach to mounting. For example, the spacer dielectric layer 110 may be a dielectric adhesive and may be employed to adhere the MEMS structure 104 to the support substrate 108

Figure 29:
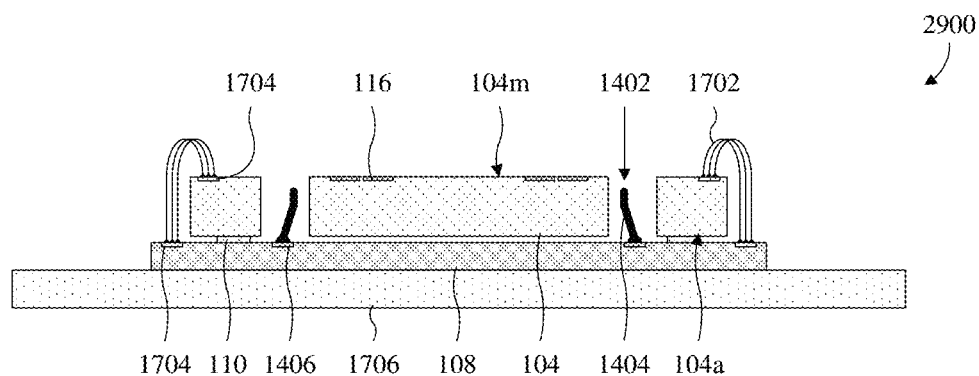

As illustrated by the cross-sectional view 2900 of FIG. 29, a second wire-bonding process is performed to form a plurality of interconnect wires 1702 extending respectively from the interconnect pads 1704 on the anchor 104a respectively to the interconnect pads 1704 on the support substrate 108. The interconnect wires 1702 may, for example, be or comprise silver, gold, copper, aluminum, or some other suitable metal.

Figure 30:
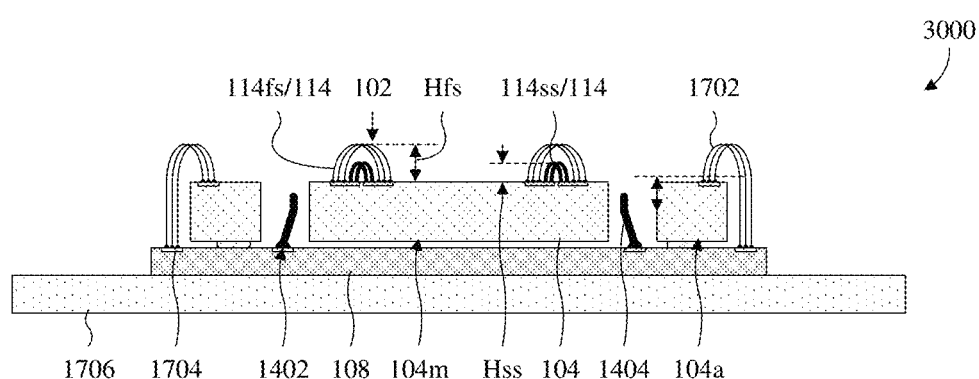

As illustrated by the cross-sectional view 3000 of FIG. 30, a third wire-bonding process is performed to form a plurality of OoP wire-bond dampers 102 on the movable mass 104m. The OoP wire-bond dampers 102 comprise individual pluralities of OoP damper wires 114 formed by the third wire-bonding process. Further, the OoP damper wires 114 are grouped into first-stage OoP damper wires 114fs and second-stage OoP damper wires 114ss.

The first-stage OoP damper wires 114fs and the second-stage OoP damper wires 114ss arch between corresponding OoP damper pads 116, such that the first-stage OoP damper wires 114fs and the second-stage OoP damper wires 114ss have loop-shaped profiles and may hence also be known as loop-type wires. Further, the first-stage OoP damper wires 114fs arch respectively over the second-stage OoP damper wires 114ss. The first-stage OoP damper wires 114fs have a first height Hfs, and the second-stage OoP damper wires 114ss have a second height Hss less than the first height Hfs. Further, the first-stage OoP damper wires 114fs have a cross-sectional profile with a lesser area than the second-stage OoP damper wires 114ss. For example, when the first-stage OoP damper wires 114fs and the second-stage OoP damper wires 114ss have circular cross-sections, the first-stage OoP damper wires 114fs have a lesser diameter than the second-stage OoP damper wires 114ss.

The OoP damper wires 114 are conductive and may, for example, be or comprise gold, copper, silver, aluminum, some other suitable metal element(s), or any combination of the foregoing. In some embodiments, the OoP damper wires 114 are electrically floating. In alternative embodiments, second-stage damper wires 114ss are omitted. In alternative embodiments, the OoP damper wires 114 are ribbon-type wires.

In some embodiments, the first height Hfs is about 200-300 micrometers, whereas the second height Hss is about 50-150 micrometers or about 150-200 micrometers. In some embodiments, the first height Hfs is about 150-200 micrometers, whereas the second height Hss is about 50-150 micrometers. In other embodiments, the first height Hfs and the second height Hss have some other suitable values. In some embodiments, the second-stage OoP damper wires 114ss arch between the same damper pads 116 as the neighboring first-stage OoP damper wires 114fs. In alternative embodiments, the second-stage OoP damper wires 114ss arch between different damper pads 116 as the neighboring first-stage OoP damper wires 114fs.

Figure 31:
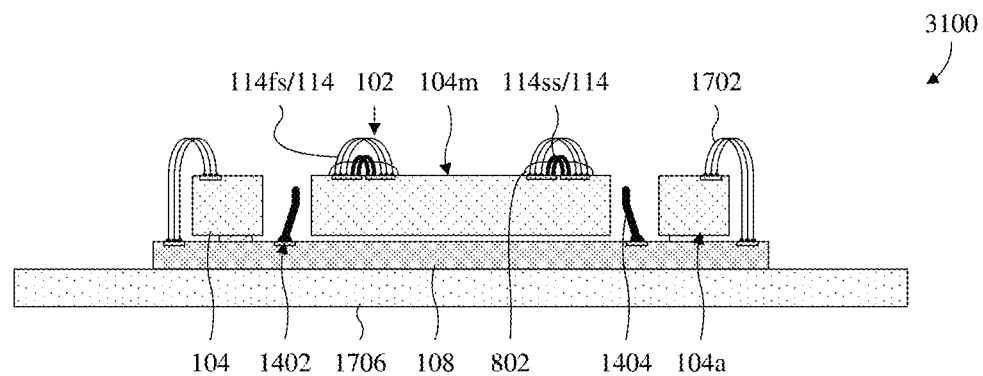

As illustrated by the cross-sectional view 3100 of FIG. 31, epoxy layers 802 are deposited respectively on the OoP wire-bond dampers 102. The epoxy layers 802 enhance strength of the OoP damper wires 114 and may therefore prevent over deformation of the OoP damper wires 114 during damping. In alternative embodiments, the epoxy layers 802 are not formed.

Figure 32:
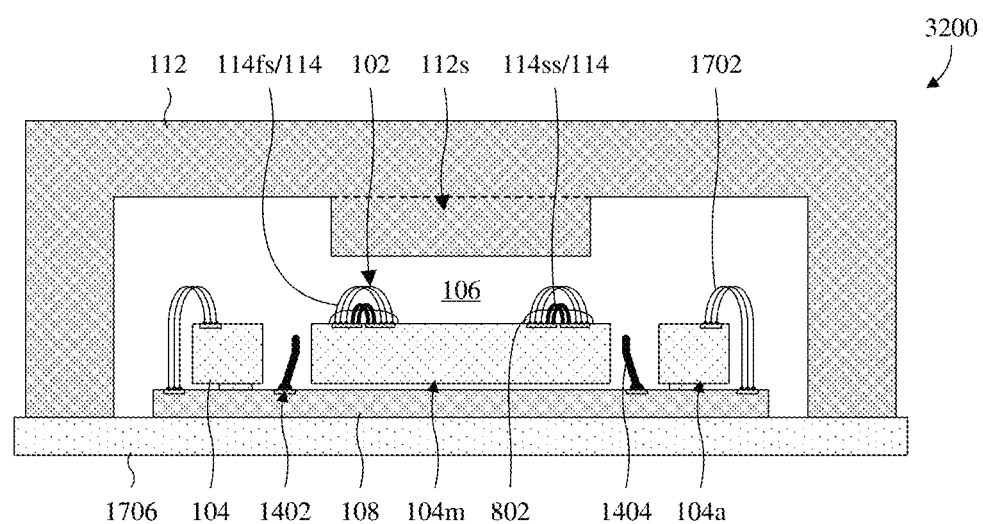

As illustrated by the cross-sectional view 3200 of FIG. 32, a housing structure 112 is formed and is further arranged over and secured to the package substrate 1706 to form and seal a cavity 106. In some embodiments, the housing structure 112 is secured to the package substrate 1706 by an adhesive, by fusion bonding, or by some other suitable approach to mounting. The housing structure 112 further has a stopper 112s overlying the movable mass 104m to stop the movable mass from overextending and damaging springs (see, e.g., 104s of FIG. 24) of the movable mass 104m. The housing structure 112 may, for example, be or comprise a polymer, silicon, some other suitable material, or any combination of the foregoing.

In some embodiments in which the housing structure 112 is a polymer, the housing structure 112 may be formed by molding. In some embodiments in which the housing structure 112 is silicon, the housing structure 112 may be formed by providing a bulk silicon substrate and patterning the bulk silicon substrate by semiconductor manufacturing process.

In alternative embodiments, the OoP wire-bond dampers 102 are as illustrated and described with regard to any of FIGS. 1-5, 9-15, 16A-16F, 17, 18, and 23-25. In alternative embodiments, the third wire-bonding process is performed before the mounting at FIG. 28 to form the OoP wire-bond dampers 102 on an underside of the MEMS structure 104 as in FIG. 12A. In alternative embodiments, the third wire-bonding process is performed before the mounting at FIG. 28 to form the OoP wire-bond dampers 102 on the support substrate 108 as in FIG. 12B. In alternative embodiments, the third wire-bonding process is performed between forming the housing structure 112 and mounting the housing structure 112 to form the OoP wire-bond dampers 102 on an underside of the housing structure 112 as in FIG. 11. In alternative embodiments, the second wire-bonding process is performed after the third wire-bonding process. In alternative embodiments, the second-stage OoP damper wires 114ss are formed by the second wire-bonding process and the first-stage OoP damper wires 114fs and the interconnect wires 1702 are formed together by the third wire-bonding process.

Figure 33:
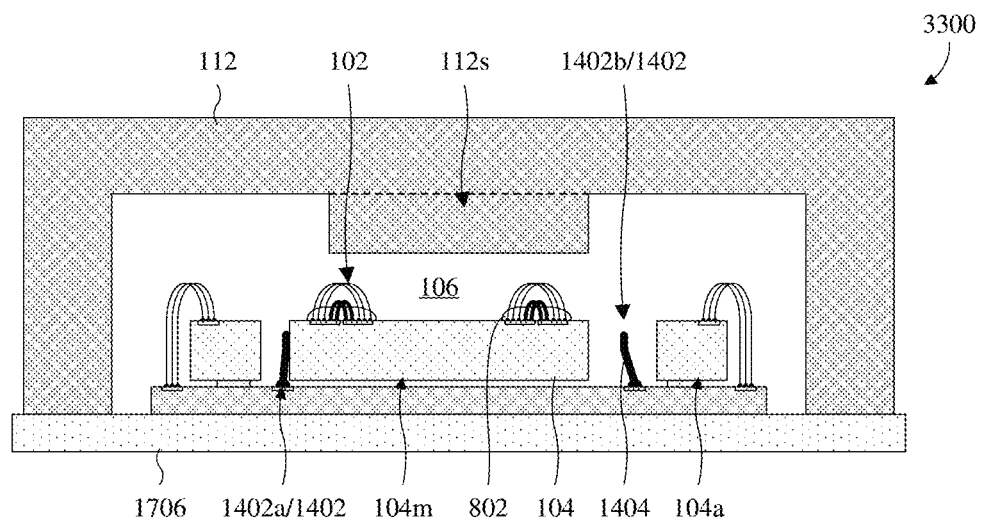

As illustrated by the cross-sectional view 3300 of FIG. 33, the MEMS structure 104 undergoes a sudden shock that propels the movable mass 104m towards a first in-plane wire-bond damper 1402a. As a result, the movable mass 104m comes into contact with the first in-plane wire-bond damper 1402a. The first in-plane wire-bond damper 1402 deforms and absorbs kinetic energy of the movable mass 104m to dampen the sudden shock. If the sudden shock had instead propelled the movable mass 104m towards a second in-plane wire-bond damper 1402b, the kinetic energy would have similarly been absorbed.

By absorbing kinetic energy and by dampening sudden shocks, the in-plane wire-bond dampers 1402 may prevent the movable mass 104m from colliding with the anchor 104a and may therefore prevent damage to the movable mass 104m. Because the in-plane wire-bond dampers 1402 provide damping independent of the springs (see, e.g., 104s in FIG. 24) of the MEMS structure 104, sensitivity of the MEMS structure 104 is not impacted, or is otherwise minimally impacted, by inclusion of the in-plane wire-bond dampers 1402.

Figure 34:
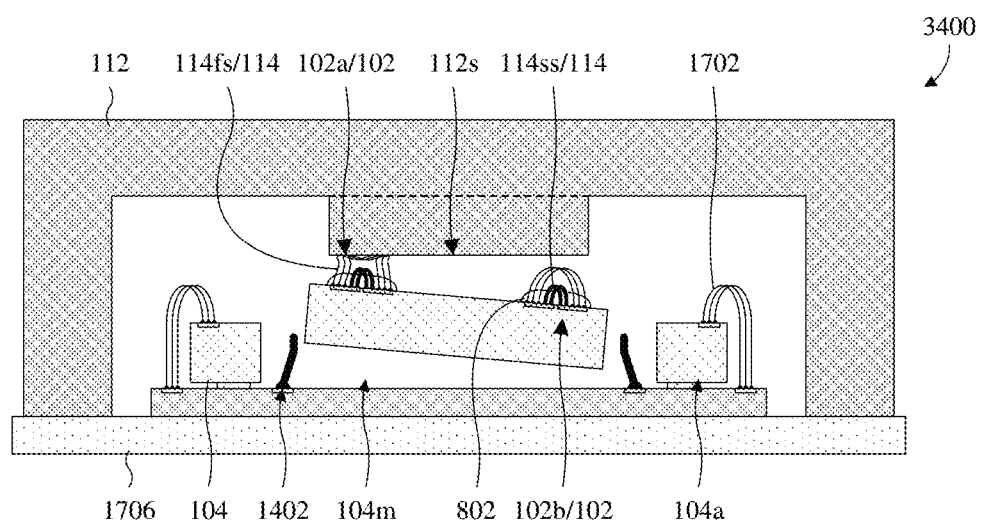

As illustrated by the cross-sectional view 3400 of FIG. 34, the MEMS structure 104 undergoes another sudden shock that propels the movable mass 104m towards the housing structure 112. As a result, a first OoP wire-bond damper 102a comes into contact with the housing structure 112. The first OoP wire-bond damper 102a deforms and absorbs kinetic energy of the movable mass 104m to dampen the sudden shock. If a second OoP wire-bond damper 102b had additionally or alternatively come into contact with the housing structure 112, the second OoP wire-bond damper 102b would have similarly deformed and absorbed kinetic energy. Because the OoP wire-bond dampers 102 are multiple-stage dampers, the OoP wire-bond dampers 102 can dampen multiple degrees of sudden shock. As illustrated, the sudden shock is being absorbed solely by first-stage OoP damper wires 114fs. If sudden shock exceeds a threshold amount, second-stage OoP damper wires 114ss will further absorb some of shock. See, for example, the first OoP wire-bond damper 102a of FIGS. 7A and 7B.

By absorbing kinetic energy and by dampening sudden shocks, the OoP wire-bond dampers 102 may prevent the movable mass 104m from colliding with the housing structure 112 and may therefore prevent damage. Because the OoP wire-bond dampers 102 provides damping independent of the springs (see, e.g., 104s in FIG. 24) of the MEMS structure 104, sensitivity of the MEMS structure 104 is not impacted, or is otherwise minimally impacted, by inclusion of the OoP wire-bond dampers 102.

While FIGS. 26-34 are described with reference to some embodiments of a method, it will be appreciated that the structures shown in FIGS. 26-34 are not limited to the method but rather may stand alone separate of the method. While FIGS. 26-34 are described as a series of acts, it will be appreciated that the order of the acts may be altered in other embodiments. While FIGS. 26-34 illustrate and describe as a specific set of acts, some acts that are illustrated and/or described may be omitted in other embodiments. Further, acts that are not illustrated and/or described may be included in other embodiments.

Figure 35:
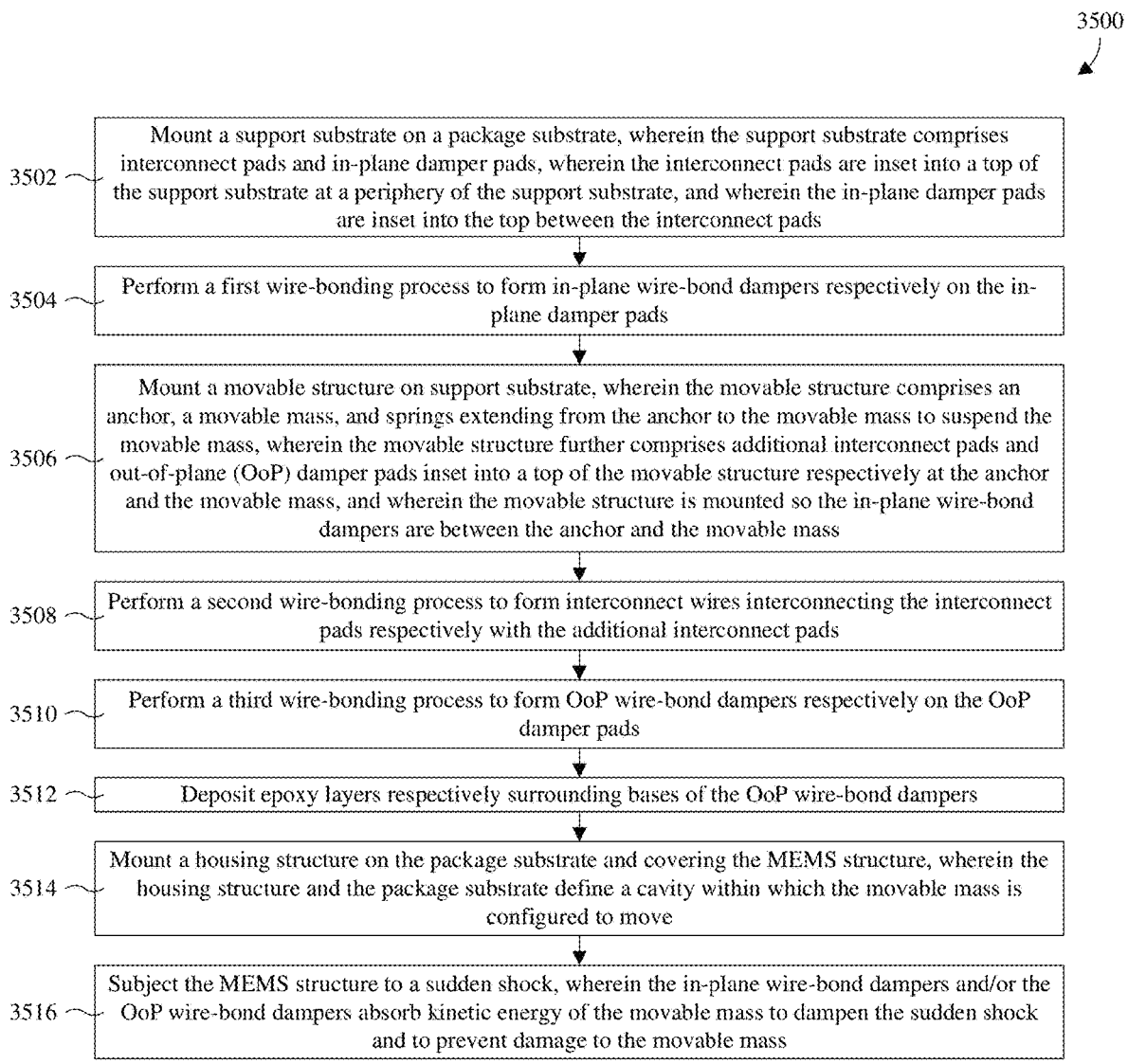
FIG. 35 provides a block diagram of some embodiments of the method of FIGS. 26-34.

With reference to FIG. 35, a block diagram 3500 of some embodiments of the method of FIGS. 26-34 is provided.

At 3502, a support substrate is mounted on a package substrate, wherein the support substrate comprises interconnect pads and in-plane damper pads, wherein the interconnect pads are inset into a top of the support substrate at a periphery of the support substrate, and wherein the in-plane damper pads are inset into the top between the interconnect pads. See, for example, FIG. 26.

At 3504, a first wire-bonding process is performed to form in-plane wire-bond dampers respectively on the in-plane damper pads. See, for example, FIG. 27.

At 3506, a movable structure is mounted on support substrate, wherein the movable structure comprises an anchor, a movable mass, and springs extending from the anchor to the movable mass to suspend the movable mass, wherein the movable structure further comprises additional interconnect pads and OoP damper pads inset into a top of the movable structure respectively at the anchor and the movable mass, and wherein the movable structure is mounted so the in-plane wire-bond dampers are between the anchor and the movable mass. See, for example, FIG. 28.

At 3508, a second wire-bonding process is performed to form interconnect wires interconnecting the interconnect pads respectively with the additional interconnect pads. See, for example, FIG. 29.

At 3510, a third wire-bonding process is performed to form OoP wire-bond dampers respectively on the OoP damper pads. See, for example, FIG. 30.

At 3512, epoxy layers are deposited respectively surrounding bases of the OoP wire-bond dampers. See, for example, FIG. 31.

At 3514, a housing structure is mounted on the package substrate and covering the MEMS structure, wherein the housing structure and the package substrate define a cavity within which the movable mass is configured to move. See, for example, FIG. 32.

At 3516, the MEMS structure is subjected to a sudden shock, wherein the in-plane wire-bond dampers and/or the OoP wire-bond dampers absorb kinetic energy of the movable mass to dampen the sudden shock and to prevent damage to the movable mass. See, for example, FIGS. 33 and 34.

While the block diagram 3500 of FIG. 35 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present disclosure provides a MEMS package including: a support substrate; a housing structure overlying the support substrate; a MEMS structure between the support substrate and the housing structure, wherein the MEMS structure includes a movable mass configured to move within a cavity between the support substrate and the housing structure; and a first wire-bond damper in the cavity and configured to dampen shock to the movable mass, wherein the first wire-bond damper includes a first wire extending transverse to a top surface of the support substrate. In some embodiments, the first wire-bond damper overlies and extends upward from a top surface of the movable mass and is configured to dampen vertical shock to the movable mass. In some embodiments, the MEMS structure includes an anchor and a spring, wherein the spring extends from the anchor to the movable mass to suspend the movable mass, wherein the first wire-bond damper extends upward from the top surface of the support substrate, laterally between the anchor and the movable mass, and is configured to dampen lateral shock to the movable mass. In some embodiments, the first wire arches from a first location on a top surface of the movable mass to a second location on the top surface of the movable mass. In some embodiments, the first wire-bond damper includes a second wire arching from a third location on the top surface of the movable mass to a fourth location on the top surface of the movable mass, wherein the first and third locations border, wherein the second and fourth locations border, and wherein the first and second wires have different heights. In some embodiments, the first wire-bond damper includes a second wire arching from a third location on the top surface of the movable mass to a fourth location on the top surface of the movable mass, wherein the first and third locations border, wherein the second and fourth locations border, and wherein the first and second wires have different cross-sectional areas. In some embodiments, the first wire extends upward from a first location on a top surface of the movable mass and terminates at a second location spaced from and elevated above the top surface of the movable mass. In some embodiments, the first wire has a rectangular cross section from the first location to the second location. In some embodiments, the first wire has a first segment and a second segment arranged end to end, wherein the first segment extends upward from a top surface of the movable mass at a first angle relative to the top surface, wherein the second segment extends from the first segment parallel to the top surface or at a second angle relative to the top surface, and wherein the second angle is less than the first angle. In some embodiments, the first wire-bond damper includes an epoxy layer surrounding a base of the first wire-bond damper.

In some embodiments, the present disclosure provides a MEMS package including: a support substrate; a housing structure overlying the support substrate; a MEMS structure between the support substrate and the housing structure, wherein the MEMS structure includes a movable mass, an anchor, and a spring, wherein the anchor surrounds the movable mass, wherein the spring extends from the anchor to the movable mass to suspend the movable mass in a cavity between the support substrate and the housing structure, and wherein the movable mass is configured to move in the cavity; and a plurality of OoP wire-bond dampers overlying the movable mass, wherein the OoP wire-bond dampers extend upward from a top surface of the movable mass respectively at corners of the movable mass. In some embodiments, the MEMS package further includes an in-plane wire-bond damper extending upward from a top surface of the support substrate, laterally between the anchor and the movable mass. In some embodiments, the in-plane wire-bond damper includes a first wire, wherein the first wire has a first segment and a second segment arranged end to end, wherein the first segment extends upward at a first angle relative to the top surface of the support substrate, wherein the second segment extends from the first segment at a second angle relative to the top surface, and wherein the second angle is greater than the first angle. In some embodiments, the MEMS structure includes a first metal pad embedded in the top surface of the movable mass, wherein a first OoP wire-bond damper of the plurality of OoP wire-bond dampers includes a ribbon-type wire having a first end affixed to the first metal pad and a second end elevated above the movable mass. In some embodiments, the MEMS structure includes a first metal pad and a second metal pad, wherein the first and second metal pads are embedded in the top surface of the movable mass, and wherein a first OoP wire-bond damper of the plurality of OoP wire-bond dampers includes a wire arching from the first metal pad to the second metal pad. In some embodiments, the first wire-bond damper and/or the second wire-bond damper is/are electrically floating.

In some embodiments, the present disclosure provides a method for forming a MEMS package, wherein the method includes: mounting a support substrate on a package substrate; mounting a MEMS structure on the support substrate, wherein the MEMS structure includes a movable mass configured to move over the support substrate; performing one or more wire-bonding processes to form an in-plane wire-bond damper on the support substrate, at a side of the movable mass, and/or to form an OoP wire-bond damper on a top surface of the movable mass; and mounting a housing structure to the package substrate, wherein the housing structure covers and surrounds the MEMS structure. In some embodiments, the one or more wire-bonding processes form the in-plane wire-bond damper on the support substrate, wherein the in-plane wire-bond damper is configured to dampen lateral shock to the movable mass. In some embodiments, the one or more wire-bonding processes form the OoP wire-bond damper on the top surface of the movable mass, wherein the OoP wire-bond damper is configured to dampen vertical shock to the movable mass. In some embodiments, the one or more wire-bonding processes form the OoP wire-bond damper including a first arch-shaped wire and a second arch-shaped wire bordering on the top surface of the movable mass, wherein the first arch-shaped wire overlaps with the second arch-shaped wire and has a greater height than the second arch-shaped wire.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a microelectromechanical systems (MEMS) package, wherein the method comprises:
   mounting a support substrate on a package substrate;
   mounting a MEMS structure on the support substrate, wherein the MEMS structure comprises a movable mass configured to move over the support substrate, and further comprises a first conductive pad and a second conductive pad that are on a top of the movable mass and that are laterally spaced from each other;
   performing one or more wire-bonding processes to form an out-of-plane (OoP) wire-bond damper on a top surface of the movable mass; and
   mounting a housing structure to the package substrate, wherein the housing structure covers and surrounds the MEMS structure;
   wherein the OoP wire-bond damper is formed comprising a first arch-shaped wire, and wherein a first wire-bonding process of the one or more wire-bonding processes forms the first arch-shaped wire arching continuously from direct contact with the first conductive pad to direct contact with the second conductive pad.

2. The method according to claim 1, wherein the one or more wire-bonding processes further form an in-plane wire-bond damper on the support substrate, at a side of the movable mass, and wherein the in-plane wire-bond damper is configured to dampen lateral shock to the movable mass.

3. The method according to claim 1, wherein the OoP wire-bond damper is configured to dampen vertical shock to the movable mass.

4. The method according to claim 1, wherein the one or more wire-bonding processes form the OoP wire-bond damper further comprising-a a second arch-shaped wire bordering the first arch-shaped wire on the top surface of the movable mass, and wherein the first arch-shaped wire overlaps with the second arch-shaped wire and has a greater height than the second arch-shaped wire.

5. The method according to claim 2, wherein the OoP wire-bond damper is configured to dampen vertical shock to the movable mass.

6. The method according to claim 2, wherein the MEMS structure is mounted on the support substrate after forming the in-plane wire-bond damper.

7. The method according to claim 1, wherein the MEMS structure is mounted to the support substrate via a spacer dielectric layer, which is an adhesive separating the MEMS structure from the support substrate.

8. The method according to claim 1, wherein the first and second conductive pads are inset into the top of the movable mass and have individual top surfaces level with the top surface of the movable mass.

9. A method for forming a microelectromechanical systems (MEMS) package, wherein the method comprises:
    mounting a MEMS structure on a support substrate, wherein the MEMS structure comprises an anchor, a spring, and a movable mass, and wherein the spring extends from the anchor to the movable mass to suspend the movable mass over the support substrate;
    performing one or more wire-bonding processes to form a first wire-bond damper on a top surface of the movable mass, wherein the first wire-bond damper comprises a first wire extending transverse to the top surface of the movable mass;
    depositing an epoxy layer surrounding a bottom of the first wire, wherein a top of the first wire protrudes from a top of the epoxy layer; and
    arranging a housing structure over and around the MEMS structure.

10. The method according to claim 9, wherein the first wire-bond damper comprises a plurality of neighboring wires, including the first wire, wherein each of the plurality of neighboring wires has an arch-shaped profile.

11. The method according to claim 10, wherein the epoxy layer is deposited surrounding bottoms of the plurality of neighboring wires, wherein tops of the plurality of neighboring wires protrude from a top of the epoxy layer.

12. The method according to claim 9, wherein the one or more wire-bonding processes form a second wire-bond damper on the top surface of the movable mass, and wherein the first and second wire-bond dampers are formed on opposite sides of the movable mass.

13. The method according to claim 9, further comprising:
    performing one or more additional wire-bonding processes to form wire bonds electrically coupling the support substrate to the anchor of the MEMS structure.

14. The method according to claim 9, further comprising:
    performing one or more additional wire-bonding processes to form a second wire-bond damper extending from the support substrate, wherein the MEMS structure is mounted to the support substrate so the second wire-bond damper is between the anchor and the movable mass.

15. The method according to claim 9, further comprising:
    shocking the MEMS structure, such that the movable mass moves towards the housing structure with a kinetic energy, wherein the first wire-bond damper absorbs the kinetic energy to prevent the movable mass from colliding with the housing structure.

16. A method for forming a microelectromechanical systems (MEMS) package, wherein the method comprises:
    performing one or more wire-bonding processes to form a first wire-bond damper, wherein the first wire-bond damper has a rectilinear profile extending from a top surface of a support substrate;
    mounting a MEMS structure on the support substrate, wherein the MEMS structure comprises an anchor, a spring, and a movable mass, and wherein the spring extends from the anchor to the movable mass to suspend the movable mass over the support substrate; and
    arranging a housing structure over and around the MEMS structure;
    wherein the first wire-bond damper is between the anchor and the movable mass after the mounting of the MEMS structure.

17. The method according to claim 16, wherein the first wire-bond damper has a first linear segment extending at an acute angle, relative to the top surface of the support substrate, and further has a second linear segment extending vertically from an end of the first linear segment.

18. The method according to claim 16, wherein the one or more wire-bonding processes further form a second wire-bond damper, wherein the second wire-bond damper has another rectilinear profile extending from the top surface of the support substrate, and wherein the second wire-bond damper is on an opposite side of the movable mass as the first wire-bond damper, and is between the anchor and the movable mass, after the mounting of the MEMS structure.

19. The method according to claim 16, further comprising:
    performing one or more additional wire-bonding processes to form a second wire-bond damper on a top surface of the movable mass.

20. The method according to claim 16, further comprising:
    shocking the MEMS structure, such that the movable mass moves towards the anchor with a kinetic energy, wherein the first wire-bond damper absorbs the kinetic energy to prevent the movable mass from colliding with the anchor.

* * * * *